US011784290B2

(12) United States Patent
Maki

(10) Patent No.: US 11,784,290 B2
(45) Date of Patent: Oct. 10, 2023

(54) LIGHT-EMITTING DEVICE WITH IMPROVED FLEXURAL RESISTANCE AND ELECTRICAL CONNECTION BETWEEN LAYERS, PRODUCTION METHOD THEREFOR, AND DEVICE USING LIGHT-EMITTING DEVICE

(71) Applicant: NICHIA CORPORATION, Anan (JP)

(72) Inventor: Keiichi Maki, Asahikawa (JP)

(73) Assignee: NICHIA CORPORATION, Anan (JP)

( * ) Notice: Subject to any disclaimer, the term of this patent is extended or adjusted under 35 U.S.C. 154(b) by 128 days.

(21) Appl. No.: 16/854,967

(22) Filed: Apr. 22, 2020

(65) Prior Publication Data

US 2020/0251630 A1   Aug. 6, 2020

Related U.S. Application Data

(60) Division of application No. 15/802,703, filed on Nov. 3, 2017, now abandoned, which is a continuation of
(Continued)

(30) Foreign Application Priority Data

Mar. 28, 2013 (JP) .................................. 2013-069988
Mar. 28, 2013 (JP) .................................. 2013-069989

(51) Int. Cl.
 *H01L 33/38* (2010.01)
 *H01L 33/54* (2010.01)
(Continued)

(52) U.S. Cl.
 CPC .............. *H01L 33/54* (2013.01); *H01L 33/38* (2013.01); *H01L 33/387* (2013.01); *H01L 33/56* (2013.01);
(Continued)

(58) Field of Classification Search
 CPC ..... H01L 33/62; H01L 25/0753; H01L 33/22; H01L 33/56; H01L 2224/16; H01L 33/52;
(Continued)

(56) References Cited

U.S. PATENT DOCUMENTS 5,283,446 A * 2/1994 Tanisawa ................. G02B 6/42
257/737
5,420,706 A   5/1995 Yamazaki et al.
(Continued)

FOREIGN PATENT DOCUMENTS

CN    101689558 A     3/2010
CN    102024913 A *   4/2011  ......... H01L 51/5275
(Continued)

OTHER PUBLICATIONS

International Search Report (Application No. PCT/JP2014/058747) dated May 13, 2014.
(Continued)

*Primary Examiner* — David Chen
(74) *Attorney, Agent, or Firm* — Foley & Lardner LLP

(57) ABSTRACT

A light-emitting device includes a pair of light-transmissive insulator sheets disposed opposite to each other and two types of light-transmissive electroconductive layers disposed on a common one of or separately on one and the other of the pair of light-transmissive insulator sheets, and at least one light-emitting semiconductor each provided with a cathode and an anode which are individually and electrically connected to the two types of the light-transmissive electroconductive layers. The electrical connection and mechanical bonding between the members are improved by a light-transmissive elastomer which is between the pair of light-transmissive insulator sheets. A method in which a
(Continued)

light-emitting semiconductor element and a light-transmissive electroconductive member are subjected to vacuum hot-pressing.

20 Claims, 17 Drawing Sheets

Related U.S. Application Data application No. 14/771,816, filed as application No. PCT/JP2014/058747 on Mar. 27, 2014, now Pat. No. 9,837,587.

(51) Int. Cl.
*H01L 33/56* (2010.01)
*H01L 33/62* (2010.01)
*B32B 17/10* (2006.01)
*H01L 25/075* (2006.01)

(52) U.S. Cl.
CPC ........ *H01L 33/62* (2013.01); *B32B 17/10036* (2013.01); *H01L 25/0753* (2013.01); *H01L 2224/16225* (2013.01); *H01L 2924/07811* (2013.01); *H01L 2933/005* (2013.01)

(58) Field of Classification Search
CPC ....... H01L 33/38; H01L 33/54; H01L 33/387; H01L 2224/16225; H01L 2933/005; H01L 2924/07811; B32B 17/10036
USPC ......... 257/88, 98, 99, 100, E25.02, E33.064, 257/E33.066; 438/26, 28, 29, 34
See application file for complete search history.

(56) References Cited

U.S. PATENT DOCUMENTS

| | | | |
|---|---|---|---|
| 6,693,352 B1 | 2/2004 | Huang et al. | |
| 7,952,107 B2 | 5/2011 | Daniels et al. | |
| 8,044,415 B2 | 10/2011 | Messere et al. | |
| 2002/0096254 A1 | 7/2002 | Kober et al. | |
| 2002/0150776 A1 | 10/2002 | Imai et al. | |
| 2003/0047745 A1* | 3/2003 | Suzuki | H01L 24/32 257/E33.074 |
| 2005/0087747 A1* | 4/2005 | Yamada | H05K 1/0274 257/E25.032 |
| 2005/0156297 A1 | 7/2005 | Farnworth et al. | |
| 2005/0214963 A1 | 9/2005 | Daniels et al. | |
| 2006/0163590 A1 | 7/2006 | Erchak et al. | |
| 2007/0001315 A1 | 1/2007 | Yokoyama et al. | |
| 2007/0215895 A1 | 9/2007 | Amoh et al. | |
| 2007/0272930 A1 | 11/2007 | Tseng et al. | |
| 2008/0038505 A1 | 2/2008 | Salzmann | |
| 2008/0224153 A1 | 9/2008 | Tomoda | |
| 2008/0278828 A1 | 11/2008 | Rau et al. | |
| 2009/0092807 A1 | 4/2009 | Hu et al. | |
| 2009/0114928 A1 | 5/2009 | Messere et al. | |
| 2009/0140410 A1 | 6/2009 | Higashi | |
| 2009/0289381 A1 | 11/2009 | Burmeister et al. | |
| 2010/0006884 A1* | 1/2010 | Ou | H01L 33/40 438/38 |
| 2010/0108141 A1 | 5/2010 | Fukushima et al. | |
| 2010/0117070 A1* | 5/2010 | Adekore | H01L 21/02403 257/43 |
| 2010/0147355 A1 | 6/2010 | Shimizu et al. | |
| 2010/0176705 A1 | 7/2010 | Van Herpen et al. | |
| 2010/0279125 A1 | 11/2010 | Buyuktanir et al. | |
| 2012/0202936 A1 | 8/2012 | Shi et al. | |
| 2012/0292760 A1 | 11/2012 | Narita et al. | |
| 2013/0102734 A1 | 4/2013 | Takaragi et al. | |
| 2013/0105852 A1* | 5/2013 | Lou | H01L 33/62 438/118 |
| 2014/0034981 A1 | 2/2014 | Hung et al. | |
| 2014/0124257 A1 | 5/2014 | Yoshihara et al. | |
| 2014/0130866 A1* | 5/2014 | Yoshimine | H01L 31/0481 136/259 |
| 2014/0264401 A1 | 9/2014 | Brooks et al. | |
| 2015/0014708 A1 | 1/2015 | Speier et al. | |
| 2016/0027973 A1 | 1/2016 | Maki | |

FOREIGN PATENT DOCUMENTS

| | | | |
|---|---|---|---|
| EP | 794689 A1 * | 9/1997 | ............ H05B 33/06 |
| EP | 2 980 871 A1 | 2/2016 | |
| JP | 60-26243 0 A1 | 12/1985 | |
| JP | 61-6833 A1 | 1/1986 | |
| JP | 61-194732 A1 | 8/1986 | |
| JP | H03-21983 A1 | 1/1991 | |
| JP | H08-282006 A1 | 10/1996 | |
| JP | 11-145381 A1 | 5/1999 | |
| JP | 11-177147 A1 | 7/1999 | |
| JP | 2000-227952 A1 | 8/2000 | |
| JP | 2000-299411 | 10/2000 | |
| JP | 2002-246418 A1 | 8/2002 | |
| JP | 2006-86193 A1 | 3/2006 | |
| JP | 2007-531321 A1 | 11/2007 | |
| JP | 2008-34473 A1 | 2/2008 | |
| JP | 2009-10204 A1 | 1/2009 | |
| JP | 2009-512977 A1 | 3/2009 | |
| JP | 2009-283939 A1 | 12/2009 | |
| JP | 2010-123802 A1 | 6/2010 | |
| JP | 2011-134926 A1 | 7/2011 | |
| JP | 2011-228463 A1 | 11/2011 | |
| JP | 2012-084855 A1 | 4/2012 | |
| JP | 2012-231018 A1 | 11/2012 | |
| JP | 2014130927 A * | 7/2014 | ............ H05B 33/06 |
| JP | 5 628 460 B2 | 11/2014 | |
| WO | 2005/099310 A2 | 10/2005 | |
| WO | 2011/132589 A1 | 10/2011 | |

OTHER PUBLICATIONS

English translation of International Preliminary Report on Patentability (Chapter I) (Application No. PCT/JP2014/058747) dated Sep. 29, 2015.
Extended European Search Report (Application No. 14772962.8) dated Oct. 7, 2016.
Extended European Search Report (Application No. 14774396.7) dated Oct. 25, 2016.
Japanese Office Action (Application No. 2014-200152) dated Mar. 6, 2018 (with English Translation).
Extended European Search Report (Application No. 17198835.5) dated Apr. 9, 2018.
Chinese Office Action (Application No. 201810630947.9) dated Sep. 2, 2020, and English translation.
Non-Final Office Action in U.S. Appl. No. 17/889,137 dated Mar. 27, 2023.

* cited by examiner

LIGHT-EMITTING DEVICE WITH IMPROVED FLEXURAL RESISTANCE AND ELECTRICAL CONNECTION BETWEEN LAYERS, PRODUCTION METHOD THEREFOR, AND DEVICE USING LIGHT-EMITTING DEVICE

CROSS-REFERENCE TO RELATED APPLICATIONS

This application is a division of U.S. application Ser. No. 15/802,703, filed Nov. 3, 2017, which in turn is a continuation of U.S. application Ser. No. 14/771,816, filed Sep. 1, 2015, which in turn is the National Stage of International Application No. PCT/JP2014/058747, filed Mar. 27, 2014, which is based on and claims the priorities of Japanese Application No. 2013-069988, filed Mar. 28, 2013, and Japanese Application No. 2013-069989, filed Mar. 28, 2013, of each of which the benefits are claimed herein and the entire disclosures of each are incorporated herein by reference.

FIELD OF THE INVENTION

The embodiments relate to a light-transmissive light-emitting device equipped with light-emitting elements, its production method, and an apparatus using the light-emitting device.

BACKGROUND OF THE INVENTION

A light-transmissive light-emitting device is formed by electrically connecting electrodes disposed on light-emitting elements to light-transmissive electroconductive layers on a substrate. As the connection method, the wirebonding method has been used conventionally but is not desirable as a connection method for use in a device requiring translucency, such as a touch panel or a light-emitting device.

On the other hand, Patent documents 1-5 disclose methods not using the wirebonding method for connecting light-emitting elements in a light-emitting device.

Light-transmissive light-emitting devices disclosed in Patent documents 3-5 are useful for achieving a curved shape which cannot be realized by conventional nonflexible light-transmissive light-emitting devices.

PRIOR ART DOCUMENTS

Patent Documents

Patent document 1: JP-A 11-177147
Patent document 2: JP-A 2002-246418
Patent document 3: JP-A 2007-531321
Patent document 4: JP-A 2009-512977
Patent document 5: JP-A 2012-84855.

SUMMARY OF THE INVENTION

Problems to be Solved by the Invention

However, as for a flexible light-transmissive light-emitting device used at windows or exterior of, e.g. a car, a train, a vessel, an airplane, etc., such a light-transmissive light-emitting device is required to satisfy reliabilities under a wide temperature range and under application of repetitive stresses. Unless reliabilities are satisfied so as to clear the above-mentioned repetitive environmental conditions and operating conditions, the use of a flexible light-transmissive light-emitting device will be restricted extremely. From such viewpoints, the light-emitting devices disclosed in Patent documents 3, 4, and 5 lack sufficient reliabilities and the practical utilities thereof were limited.

Moreover, the light-emitting devices disclosed in Patent documents 3, 4 and 5 are accompanied with problems that, under application of a pressure during the production thereof, electrode edges formed on the light-emitting device, the concavities and convexities formed on the electrodes, a level difference at edges of an active layer and the device substrate, etc., are abutted against the light-transmissive conductive layer of a light-transmissive electroconductive member, thus being liable to result in a crack in or breakage of the light-transmissive conductive layer and cause disconnection leading to a lowering in production yield and an increase in production cost. Furthermore, since the light-emitting devices disclosed in Patent documents 3, 4 and 5 are accompanied with fine cracks in the light-transmissive conductive layer of light-transmissive electroconductive member during the production thereof in many cases, thus being liable to cause lighting failure in case of being bent or under application of a heat cycle, even if they are lighting immediately after production.

Furthermore, since the light-emitting devices disclosed in Patent documents 4 and 5 are insufficient in contact between the light-transmissive conductive layer and the LED electrodes, they have poor resistance to bending and leave a problem in reliability after application of heat or thermal cycles.

An embodiment of the present invention has been developed in view of the above-mentioned situation, and an object thereof is to provide a light-emitting device which is excellent in flexural resistance or in heat cycle characteristic during production or in use, or capable of persistent lighting in resistance to flexure or application of heat load, a process for production thereof and an apparatus using the light-emitting device.

Means for Solving the Problems

The inventor tested light-emitting devices including a light-transmissive elastomer disposed between a light-emitting diode (LED) chip as an example of a light-emitting element and a light-transmissive electroconductive layer, and has discovered influences of a ratio of an area of presence of the light-transmissive elastomer to an area of the electrode of the LED chip, and a proportion of the light-transmissive elastomer present at concavities of unevenness of the electrode layer on the flexural resistance of the light-emitting device. The inventor has also discovered influences of the ratio of the area of presence of the light-transmissive elastomer between the LED chip and the light-transmissive electroconductive layer to the electrode area of the LED chip, and the proportion of the light-transmissive elastomer present at concavities of unevenness of the electrode layer on the heat-cycle resistance of the light-emitting device. The term "flexural resistance" used herein refers to a resistance to deteriorations, such as crack, breakage and disconnection, when a film or sheet-like product or material subjected to a flexure (bending) or a repetition of flexures at a certain curvature radius.

A light-emitting device of this embodiment has been developed to solve the above-mentioned problem, and comprises:

a pair of light-transmissive insulator sheets each equipped with a light-transmissive electroconductive layer, or a pair of a light-transmissive insulator sheet equipped with light-transmissive electroconductive layers and a light-transmissive insulator sheet free from a light-transmissive electroconductive layer, disposed opposite to each other so as to form a region between the pair, at least one light-emitting semiconductor element each provided with a cathode and an anode which are individually electrically connected to one and the other of said light-transmissive electroconductive layers, and a light-transmissive elastomer, respectively disposed between the pair of light-transmissive insulator sheets so as to fill the region in combination, wherein the light-transmissive elastomer is at least partially present in the interface between the cathode and anode, respectively, of the light-emitting semiconductor element and the light-transmissive electroconductive layers, and the light-transmissive elastomer is also filled in concavities of the cathode and anode surfaces. Herein, the "light-emitting semiconductor element" refers generically to an element wherein a luminescence layer comprising a semiconductor causes luminescence under application of an electric field (current) formed between a pair of electrode electrically connected with the luminescence layer, which may be represented by a light-emitting diode (LED), but not restricted thereto and can also include an organic EL device and a laser diode.

A process for producing a light-emitting device according to an embodiment has been developed to solve the above-mentioned problem, and comprises:

disposing a light-transmissive elastomer between an electrode surface of a light-emitting semiconductor element and a surface of a light-transmissive electroconductive layer of a light-transmissive electroconductive member, and then subjecting the light-emitting semiconductor element and the light-transmissive electroconductive member to vacuum hot pressing at a temperature which is in a range of from 10° C. below the Vicat softening temperature to 30° C. or 20° C. above the Vicat softening temperature, respectively, of the light-transmissive elastomer.

An apparatus according an embodiment has been developed to solve the above-mentioned problem, is characterized by including the above-mentioned light-emitting device, and may representatively provide a display apparatus or an illumination apparatus.

Effect of the Invention

According to an embodiment of the present invention, there are provided: a light-emitting device that includes a light-transmissive electroconductive member comprising a light-transmissive electroconductive layer held on a light-transmissive insulator sheet, of which the light-transmissive electroconductive layer can hardly cause a crack or a fracture, that is excellent in flexural resistance or heat-cycle characteristic and that can hardly cause bubbles remaining therein, a process for production of the light-emitting device; and an apparatus including the luminescent device.

More specifically, the light-emitting device (or an apparatus including it) is characterized in that the sandwiching of a light-transmissive elastomer between an LED chip and a light-transmissive electroconductive layer, followed by hot pressing under vacuum, is effective for improving the adhesion between the light-transmissive elastomer and the transparent electroconductive member and preventing the occurrence of crack or breakage in the light-transmissive electroconductive layer, and also for partial intrusion of the elastomer between the electrode surface of the LED and the light-transmissive electroconductive layer to enhance the mechanical junction by the elastomer therebetween. As a result, even when the light-emitting device is subjected to severe bending or application of a heat cycle, the light-transmissive electroconductive layer does not readily cause a crack or a breakage, and a reliable electrical connection between the light-transmissive electro-conductive layer and the LED chip electrode is ensured, to allow a persistent lighting under such severe conditions.

Moreover, as the elastomer is processed under vacuum while preventing the melt-fusion of the elastomer causing a low-viscosity state, the remaining of air bubbles in the resultant light-emitting device is prevented. If the hot pressing is performed under an atmospheric pressure or a slight degree of reduced pressure, air bubbles remain especially in the circumference of the LED chip within the resultant light-emitting device and the air bubbles compressed during the hot pressing are liable to swell after the hot pressing, thus being further liable to cause a peeling between the LED chip electrode and the light-transmissive electroconductive layer. Furthermore, if the elastomer inserted between the LED tip and the light-transmissive electroconductive layer is melted or in a low-viscosity state at the time of the hot pressing, the LED chip is liable to be displaced or inclined to cause an electrical connection failure.

BRIEF DESCRIPTION OF THE DRAWINGS

FIGS. 6A to 6C show surface states of a first electrode layer 15A of LED chip 10 after peeling between the first electrode layer 15A and a first light-transmissive electroconductive member 20A in a light-emitting device of Example 3 according to the first embodiment; among which FIG. 6A is a scanning electron microscope photograph, FIG. 6B is an elemental mapping photograph for carbon according to energy dispersion-type X-ray analysis (EDX), and FIG. 6C is an elemental mapping photograph for tin according to EDX.

DETAILED DESCRIPTION OF THE INVENTION

In a light-emitting device according to an embodiment, a light-transmissive elastomer is disposed between an electrode surface of the LED chip and a light-transmissive electroconductive layer of a light-transmissive electroconductive member, the light-transmissive elastomer intrudes into gaps between concavities of unevenness on the LED chip electrode and the light-transmissive electroconductive layer, and the electrode layer of the LED chip and the light-transmissive electroconductive layer are electrically connected.

Incidentally, the sizes, such as thickness, width and distance, described herein are all based on values measured after standing for at least 1 hour in a room at a temperature of 20° C.±2° C. by means of a non-contact method, e.g. optically, or by comparison with a calibrated standard length after measurement through an electron microscope or an optical microscope.

The light-emitting device of an embodiment, as a result of the formation of a light-transmissive elastomer layer of a relatively high storage modulus at gaps between the LED chip electrode surface and the light-transmissive electroconductive layer surface, is provided with little liability of causing a crack and a fracture in the light-transmissive electroconductive layer even when subjected to a severe bending or application of a heat cycle to retain a sufficient contact between the light-transmissive electroconductive layer and the LED chip electrode layer, thus ensuring a reliable electrical connection therebetween and persistent lighting.

Luminescent devices of embodiments are described in more detail with reference to drawings. A light-emitting device of a first embodiment is described first.

[Luminescent Device]

First Embodiment

Figure 1:
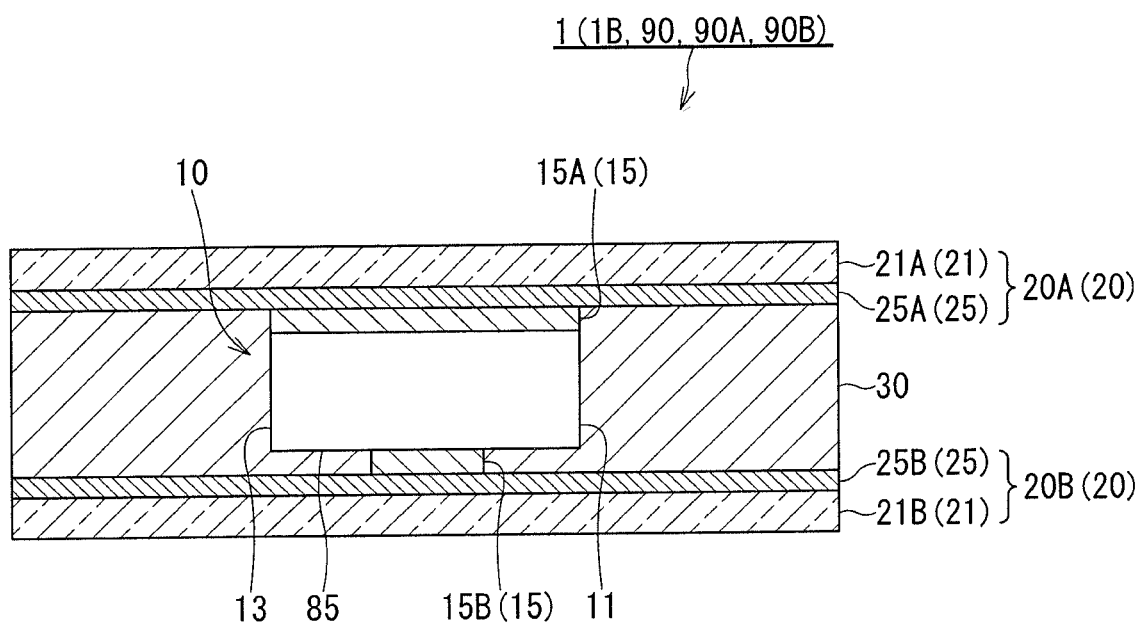
FIG. 1 is a sectional view of a light-emitting device of a first embodiment.

FIG. 1 is a sectional view of an essential part of a light-emitting device according to a first embodiment.

A light-emitting device 1, includes: an LED chip 10 including an LED body 11 and first and second electrode layers 15 (15A, 15B) formed on a front and a back face, respectively, of the LED body 11; first and second light-transmissive electroconductive members 20 (20A, 20B) respectively covering the LED chip 10 and including transparent substrates 21 (21A, 21B) and first and second light-transmissive electroconductive layers 25 (25A, 25B); and a light-transmissive elastomer layer 30 joined to a circumference 13 of the LED chip 10 and also to the light-transmissive electroconductive layer 25A of the light-transmissive electroconductive member 20A and the light-transmissive electroconductive layer 25B of the light-transmissive electroconductive member 20B.

In short, the light-emitting device 1 is formed by sandwiching the LED chip 10 with two sheets of the light-transmissive electroconductive members 20A and 20B and joining the LED chip 10 and the light-transmissive electroconductive members 20A and 20B with the light-transmissive elastomer layer 30.

<LED Chip>

Figure 2:
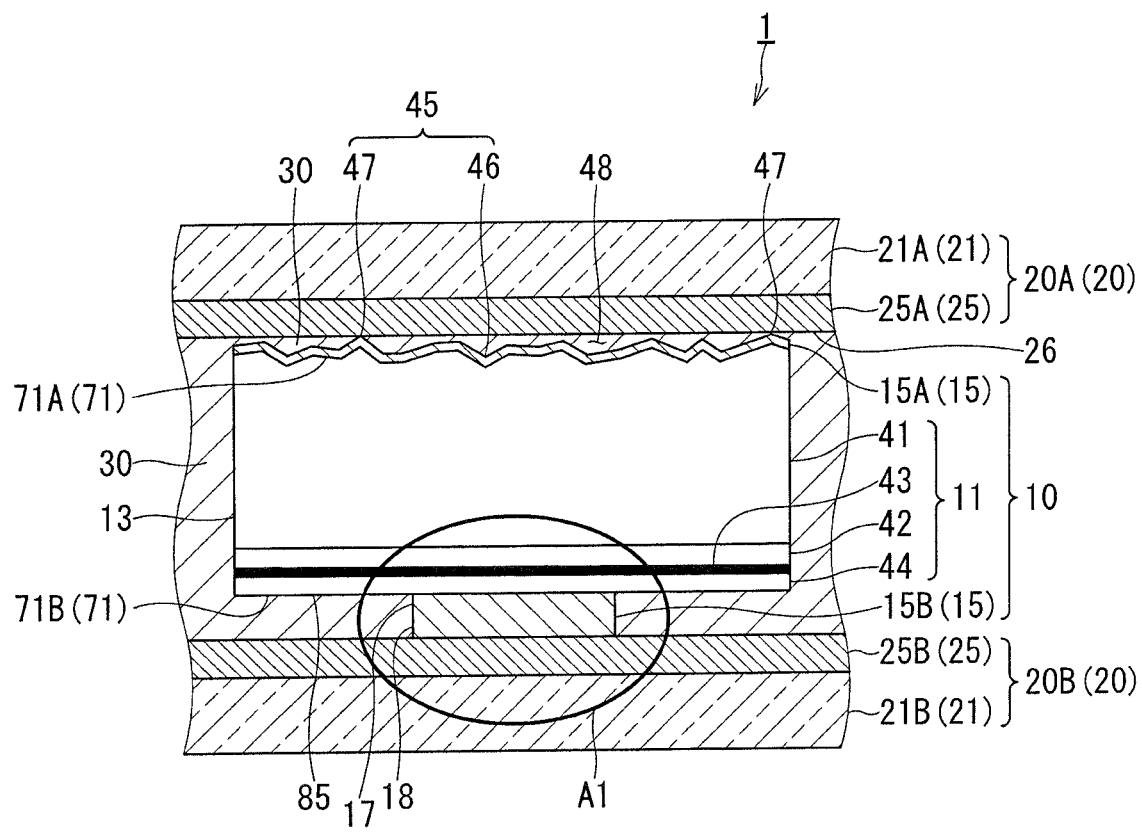
FIG. 2 is a partial enlarged view of FIG. 1.
Figure 3:
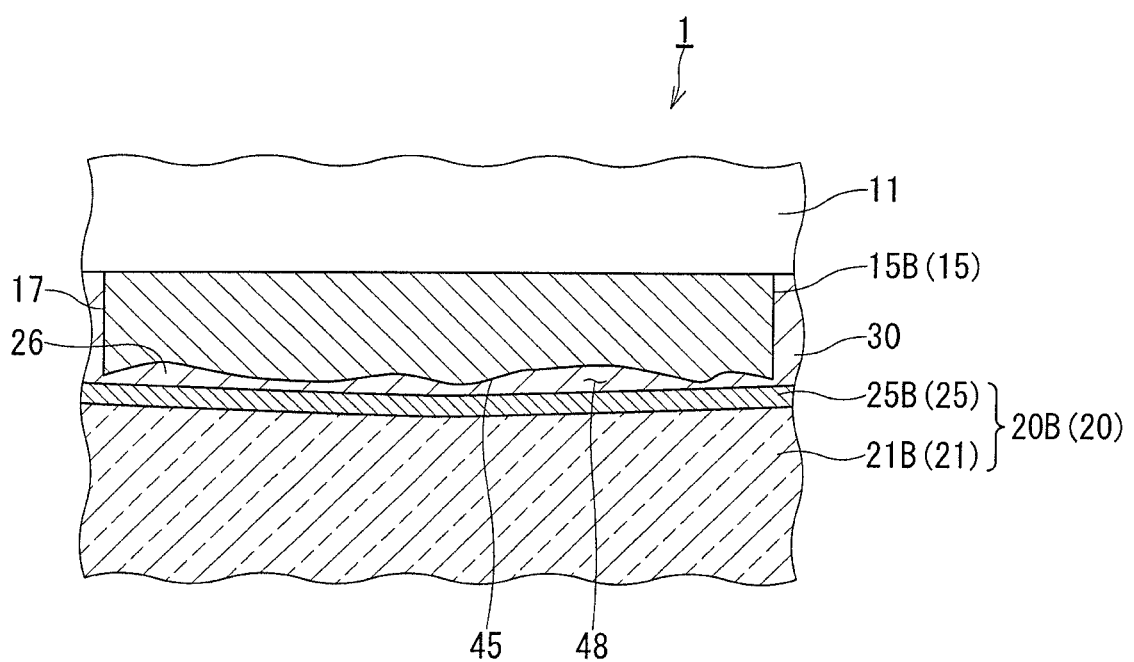
FIG. 3 is a partial enlarged view of a part A1 in FIG. 2.
Figure 4:
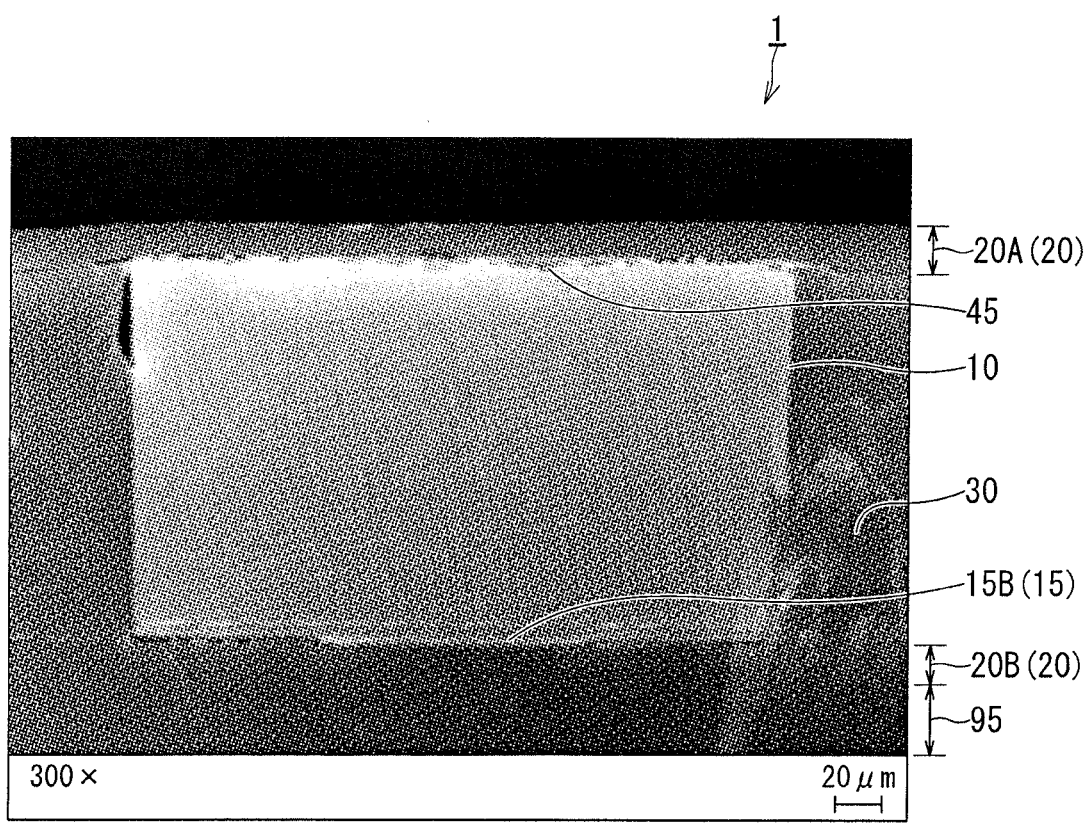
FIG. 4 is an example of cross-sectional scanning electron microscope photograph of the light-emitting device of the first embodiment.

FIG. 2 is a partial enlarged view of FIG. 1. FIG. 3 is a partial enlarged view of a part A1 in FIG. 2. FIG. 4 is an example of cross-sectional scanning electron microscope photograph of the light-emitting device of the first embodiment. In FIG. 4, a reference numeral 95 refers to a resin for fixing the light-emitting device 1 as an objective sample for cross-sectional observation thereof and is not a component of the light-emitting device 1.

The LED chip 10 has a structure including an LED body 11 having a (laminate) layer structure corresponding to a semiconductor luminescence layer of an LED, and an electrode layer 15A as a first electrode layer and a second electrode layer 15B as a second electrode layer formed on both faces of the LED body 11.

Referring to FIG. 2, the LED body 11 has an N-type semiconductor layer 42 and a P-type semiconductor layer 44 on a semiconductor substrate 41 comprising GaAs, Si, GaP, etc., and also a luminescence layer 43 formed between the N-type semiconductor layer 42 and the P-type semiconductor layer 44.

The surface of the semiconductor substrate 41 and the surface of the P-type semiconductor layer 44 constitute surfaces 71 of the LED body 11, respectively. Here, the surface of the semiconductor substrate 41 is called a first face 71A of the LED body 11 among the surfaces 71 of the LED body 11, and the surface of P-type semiconductor layer 44 is called a second face 71B of the LED body 11. The second face 71B is on the light-emitting side 85 of the LED chip 10. It is possible to form a transparent electrode layer on the surface of P-type semiconductor layer 44. In this case, this transparent electrode layer provides a second face 71B.

The electrode layer 15A is formed on the first face 71A of the LED body 11, i.e., the surface of the semiconductor substrate 41, and forms a substrate-side electrode layer which is electrically connected with N-type semiconductor layer 42 via the semiconductor substrate 41. The electrode layer 15B is formed on the second face 71B of the LED body 11, i.e., the surface of P-type semiconductor layer 44, and forms a light-emitting-side electrode layer electrically connected with the P-type semiconductor layer 44. The electrode layer 15B as the light-emitting side electrode layer is formed on a side closer to the luminescence layer 43 than the electrode layer 15A. In addition, it is possible to dispose a reflective film on the semiconductor substrate 41 surface.

The electrode layer 15A (cathode in this example), as a substrate-side electrode layer, may comprise, e.g. Au, and the thickness is usually 0.1-2 μm, preferably 0.3-1 μm. The electrode layer 15B (anode in this example) as a light-emitting-side electrode layer, may comprise, e.g. Au, and the whole thickness thereof (i.e., a height of the side wall 17 of the electrode layer 15B) is usually 0.5-20 μm, preferably 1-10 μm.

The electrode layer 15A (as the substrate side electrode layer) is formed substantially all over the first face 71A on the side of the light-transmissive electroconductive member 20A among the surfaces 71 of the LED body 11.

The electrode layer 15B (the light-emitting side electrode layer) is formed in a smaller size than, e.g. 10 to 30% of, the second face 71B of the LED body 11 so that luminescence is not substantially obstructed. In other words, the electrode layer 15B of the LED chip 10 is made smaller in areal size than the second face 71B of the LED body 11 on which this electrode layer 15B is formed. Incidentally, a transparent electrode layer can be present between the LED body 11 and the electrode layer 15B.

Generally, unevenness is formed on the first face 71A of the semiconductor substrate 41 on which the electrode layer 15A is formed, and as a result, a corresponding unevenness 45 is given to the electrode layer 15A laminated on it, thereby an improvement in connection with a contiguous layer is achieved. The unevenness 45 on the surface of the electrode layer 15A is formed of concavities 46 and convexities 47 of the electrode layer 15A.

Generally, the unevenness 45 of the electrode layer 15A is formed in order to improve the adhesion with the contiguous electroconductive layer, and a surface roughness Ra (a measuring method thereof is mentioned later) of usually 1-5 μm is given thereby. Incidentally, a surface roughness Ra of unevenness (not shown) of the surface of the electrode layer 15B is usually 0.1-1 μm.

The unevenness may be formed as a succession of concavities and convexities, or may be given by intermittent formation of concavities and/or convexities as by embossing. The surface roughness Ra of the unevenness of the surface of the electrode layers 15A and 15B can be 0.1 μm-10 μm.

The structures and materials of the semiconductor substrate 41, the P-type semiconductor layer 44 and N-type semiconductor layer 42 of the LED chip 10, and the characteristics of the LED chip 10 are not limited as long as desired luminescent performance is acquired. Moreover, it is also possible that the semiconductor substrate is a P-type or N-type semiconductor and/or the P-type semiconductor layer 44 and N-type semiconductor layer 42 are disposed upside down. However, it is desirable that the semiconductor substrate has a semiconductor type opposite to that of a semiconductor layer contiguous thereto, in view of the luminous efficiency.

The LED chip 10 may comprise an LED chip emitting, e.g. red or orange light, but may comprise an LED chip emitting another color of light or a combination of the LED chips emitting plural luminescence colors.

The LED chip 10 may ordinarily have a thickness (height) of, e.g. 90-290 μm, while it is not restricted in particular. Moreover, although the surface size of the LED chip 10 may naturally change variously with a requirement as a display element (unit) for constituting the whole area of the light-emitting device, it is usually in the range of 0.04 μm$^2$–2.25 mm$^2$.

<Light-Transmissive Electroconductive Member>

The light-transmissive electroconductive member 20 (20A, 20B) comprises a transparent substrate 21 (21A, 21B) having flexibility, and a light-transmissive electroconductive layer 25 (25A, 25B) formed on the surface of the transparent substrate 21. A pair of the light-transmissive electroconductive members 20 sandwich the LED chip 10 so that the light-transmissive electroconductive layers 25 thereof are electrically connected to the electrode layers 15 (15A, 15B) of the LED chip 10. The light-transmissive electroconductive layers 25 each form a circuit pattern for driving at least one LED chip 10 of one or plural types.

More specifically, the light-transmissive electroconductive members 20 includes a first light-transmissive electroconductive member 20A covering the LED chip 10 so that the light-transmissive electroconductive layer 25A is electrically connected to the surface of the first electrode layer 15A of the LED chip 10, a second light-transmissive electroconductive member 20B covering the LED chip 10 so that the light-transmissive electroconductive layer 25B is electrically connected to the surface of the second electrode layer 15B of the LED chip 10.

[Transparent Substrate]

The transparent substrate 21 is a substrate which is transparent or capable of light-transmission and flexible, and may be in a sheet form. The transparent substrate 21 can also be in a form of sheet having a curved surface as long as it retains light-transmissivity and flexibility.

The transparent substrate 21 has a total light transmittance (measured based on Japanese Industrial Standards JISK7375:2008) of usually 90% or more, more preferably 95% or more, so as to provide the light-emitting device of the present invention will have a total light transmittance of usually 1%-80%, preferably 5 to 70%. A higher total light transmittance provides a higher luminous intensity of the light-emitting device and is generally preferred, but a total light transmittance exceeding 80% may be undesirable, since the circuit pattern of the light-transmissive electroconductive member is liable to be recognized clearly. On the other hand, a total light transmittance lower than 1% is not desirable, since it becomes impossible to recognize each LED as a luminescent spot.

The transparent substrate 21 may have a flexural modulus (measured according to ISO178 (JIS K7171:2008)) of at least 150 kgf/mm$^2$, preferably 200 to 320 kgf/mm$^2$. The light-emitting device 1 may be provided with a preferable degree of flexibility if the transparent substrate 21 has a flexural modulus in a range of from 150 kgf/mm$^2$ to 320 kgf/mm$^2$.

The transparent substrate 21, may comprise, e.g. polyethylene terephthalate (PET), polyethylene naphthalate (PEN), polycarbonate (PC), polyethylene succinate (PES), "ARTON" (registered trademark) available from JSR Corp., acrylic resin, etc. The transparent substrate 21 may have a thickness of, e.g. usually 50-300 μm, preferably 50-200 μm.

[Light-Transmissive Electroconductive Layer]

Although the material thereof is not particularly limited, the light-transmissive electroconductive layer 25 may comprise, e.g. a thick film comprising a light-transmissive resin binder containing therein a plurality of light-transmissive electroconductive fillers in a mutually contacting state; a thin film of an electrical conductor material formed by sputtering or vapor deposition; a mesh electrode comprising a non-light transmissive conductor, such as silver-based fine particles; etc. The light-transmissive electroconductive layer 25 is a layer which has electroconductivity as well as light-transmissivity formed on the surface of the transparent substrate 21. The light-transmissive electroconductive layer 25 may have a transmittance of usually 10 to 85%.

More specifically, the light-transmissive electroconductive layer 25, may comprise: (1) a conductor film formed by sputtering, vapor deposition, etc., of light-transmissive conductors, such as ITO (indium tin oxide), ZnO (zinc oxide), etc.; (2) an applied and cured resin film of a slurry comprising particulates of light-transmissive conductors, such as ITO, ZnO, etc. as mentioned above, disperse in a light-transmissive resin (e.g. ultraviolet-curable acrylic resin); (3) mesh electrodes, formed by patterning through application, exposure and development of a photosensitive compound, such as silver halide, of a non-light-transmissive conductor such as Ag, patterning through screen printing of Ag-based or Au-based fine particles, patterning by laser irradiation or photo-etching, etc. of a film of a non-light-transmissive conductor, such as Ag, Cu, etc., formed by sputtering or electron beam vapor deposition; etc.

Among these, (1) has an advantage that a thin film electrode having stable conductivity can be formed simply, but is liable to have an inferior adhesion with a contacting light-transmissive elastomer, thus being liable to result in an inferior flexural resistance. In contrast thereto, (2) and (3) provide light-emitting devices with good flexural resistance, and particularly (2) shows especially good performance in this respect but is accompanied with a difficulty that the electroconductivity thereof is liable to change after standing for a long period at relatively high temperatures (e.g. about 100° C.). Although (3) is good in balance of flexural resistance and electric conduction stability, it involves difficulties in troublesome processing and a rather low conductivity level attained. Therefore, it is desirable to effect an appropriate selection from these, depending on the purpose, manner of use, etc. of the light-emitting device obtained.

The thus-obtained light-transmissive electroconductive layer 25 may generally have a total light transmittance of 10 to 85% and a sheet resistivity (according to a method described later) of at most 1000 ohm/□. Particularly, in view of the respective characteristics of (1)-(3) described above, it is preferred that the conductor film (1) is formed in a thickness of 0.05-2 μm and has a sheet resistivity of 10-500 ohm/□, particularly 10-50 ohm/□.

On the other hand, it is preferred that the coating film-type electroconductive layer (2) contains particulate conductor-dispersed therein, such as bar- or plate-shaped light-transmissive particulate (filler) conductors, such as ITO, ZnO, etc., having an average particle size (measured by laser diffractometry according to ISO13320-1 (JIS Z8825-1)) of 10-200 nm, especially 20-100 nm, and an aspect ratio (longer axis diameter/shorter axis or thickness) of at least 2 dispersed in a proportion of at least 50 wt. % and at most 95 wt. % or at most 90 wt. %, within a transparent binder of an acrylic resin, etc. and is formed to have a total light transmittance of at least 80%, particularly 85-99%, to have a thickness of 0.5-10 μm, particularly 1-5 μm, and a sheet resistivity of 10-500 ohm/□, particularly 10-50 ohm/□.

The particulate conductor-dispersed film-type electroconductive layer (2) shows electroconductivity represented by the above-mentioned sheet resistivity because the conductor fine particles (filler) dispersed therein are present in a mutually contacting state. For this purpose, it is desirable that the light-transmissive electroconductive filler particles are contained in the light-transmissive electroconductive layer at a rate of at least 50 wt. % and at most 95 wt. %.

If the coating-type light-transmissive electroconductive layer 25 has a thickness less than 0.5 μm, the layer is liable to have a region comprising only a light-transmissive binder having no conductivity so that the light-transmissive electroconductive layer 25 is liable to have an excessively large sheet resistivity. Moreover, if the light-transmissive electroconductive layer 25 has a thickness less than 0.5 μm, the layer is caused to have a lower strength and inferior deformation followability, so that the light-transmissive electroconductive layer 25 is liable to be broken where the layer is bent at a large degree by being abutted to an angular part such as an edge of the electrode layer 15 of the LED chip 10. On the other hand, if the thickness of the light-transmissive electroconductive layer 25 exceeds 10 μm, the formation thereof becomes difficult because of too large a thickness and the layer is liable to be broken due to bending.

The light-transmissive electroconductive layer 25 has a flexural resistance and deformation followability because the conductor fine particles (filler) dispersed therein are mutually bonded with the light-transmissive resin binder.

On the other hand, the light-transmissive electroconductive layer of the mesh-type (3) is preferably formed as a mesh of a non-light-transmissive conductor, such as Au or Ag, in a line thickness having a cross-sectional area-equivalent diameter of 2-20 μm and at a spacing of 100-1000 μm so as to provide a total light transmittance of 10 to 85%, and a sheet resistivity of 0.1-50 ohm/□, especially 0.1-10 ohm/□.

Au, etc., forming the mesh electrode is a non-light-transmissive material, but as the mesh electrode occupies only a small areal percentage, it provides a mesh electrode which shows the above-mentioned level of total light transmittance as a whole.

The light-transmissive electroconductive layer 25 according to any of the above-mentioned compositions (1)-(3) may be patterned, by a method, such as laser processing, etching, etc., into an electroconductive layer 25A connected to the electrode layer (cathode) 15A on the N-type semiconductor layer 42, or an electroconductive layer 25B connected to the electrode layer (anode) 15B on the P-type semiconductor layer 44.

<Light-Transmissive Elastomer Layer>

The light-transmissive elastomer layer 30 comprises an elastomer and is bonded to the circumference 13 of the LED chip 10 and the surfaces of the light-transmissive electroconductive layers 25 (25A, 25B) of the light-transmissive electroconductive member 20 (20A, 20B), thereby binding the LED chip 10 with the light-transmissive electroconductive members 20 (20A, 20B).

Thus, in an arrangement that the LED chip 10 is sandwiched between the light-transmissive electroconductive layer 25A side of the light-transmissive electroconductive member 20A and the light-transmissive electroconductive layer 25B side of the light-transmissive electroconductive member 20B, the light-transmissive elastomer layer 30 is disposed to fill up a space or region which is formed between the light-transmissive electroconductive member 20A and the light-transmissive electroconductive member 20B and surrounds the peripheral wall 13 of an LED chip.

More specifically, the light-transmissive elastomer layer 30 also fills up a gap space or crevice gap 48 formed between concavities 46 of the surface unevenness 45 of the electrode layer 15 of the LED chip 10 and the surface 26 of the light-transmissive electroconductive layer 25A of the light-transmissive electroconductive member 20A. Thus, if the gap space 48 is also filled up with the light-transmissive elastomer layer 30, the light-transmissive electroconductive layer 25A of the light-transmissive electroconductive member 20A becomes free from cracking, and the electrode layer 15 of the LED chip 10 and the light-transmissive electroconductive layer 25A of the light-transmissive electroconductive member 20A are bonded firmly, so that firm electrical connection and therefore a lighting state are retained even if the light-emitting device 1 is subjected to intense bending or application of heat cycle.

Figure 5:
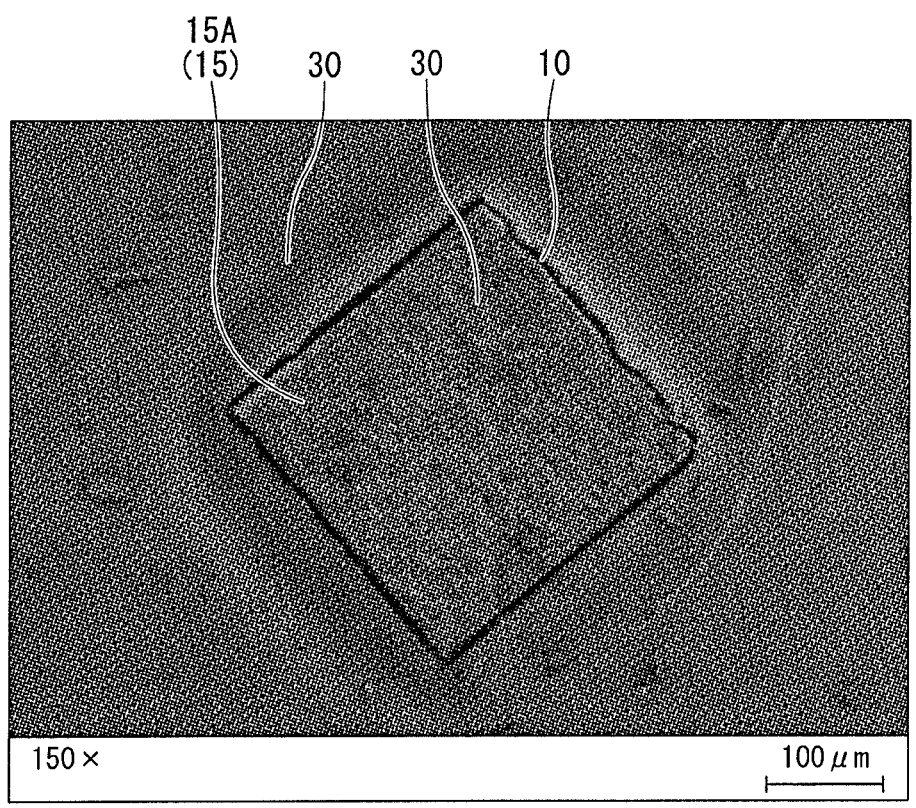
FIG. 5 is an example of scanning electron microscope photograph showing a surface state of a first electrode layer 15A of LED chip 10 after peeling between the first electrode layer 15A and a first light-transmissive electroconductive member 20A.

FIG. 5 shows an example of scanning electron microscope photograph showing a surface of the first electrode layer 15A of Au of the LED chip 10 after peeling between the first electrode layer 15A and the first light-transmissive electroconductive member 20A.

Figure 6A:
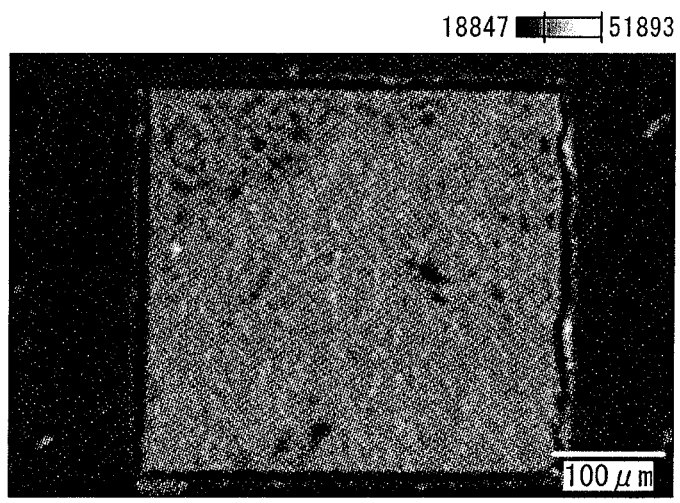
Figure 6B:
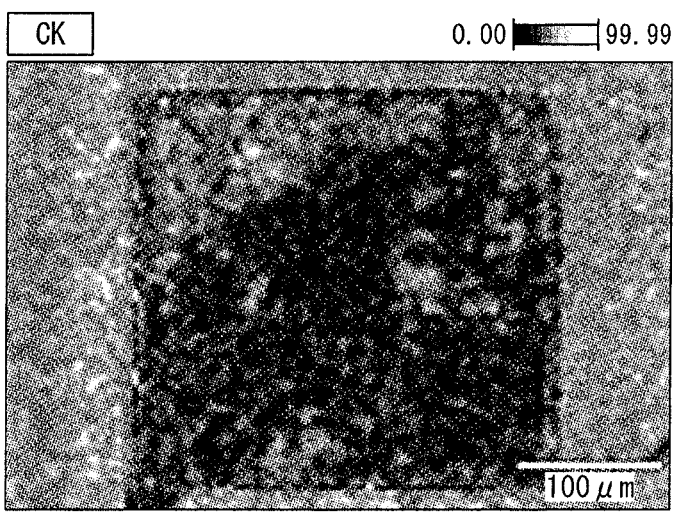
Figure 6C:
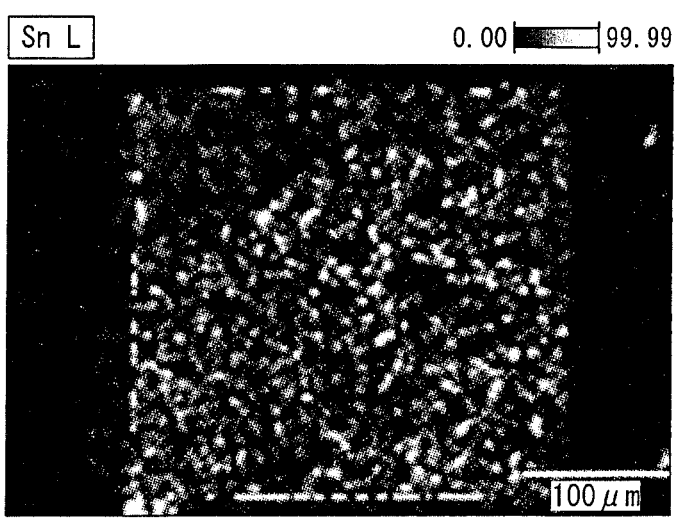

FIG. 5 shows a state where the light-transmissive elastomer layer 30 adheres firmly to the surface of the electrode layer 15A along or even more with the surface unevenness of the first electrode layer 15A of the LED chip 10 after the peeling. FIGS. 6A to 6C show surface states of a first electrode layer 15A of the LED chip 10 after peeling between the first electrode layer 15A and a first light-transmissive electroconductive member 20A in a light-emitting device according to the first embodiment; among which FIG. 6A is a scanning electron microscope photograph, FIG. 6B is an elemental mapping photograph for carbon according to energy dispersion-type X-ray analysis (EDX), and FIG. 6C is an elemental mapping photograph for tin according to EDX.

In view of these figures, it is shown that element tin (originated from an ITO-dispersed electroconductive layer 25A) is hardly observed in a region where element C (elastomer 30 origin) is frequently observed on the surface of the first electrode layer 15A of the LED 10, while element C is little observed where much element tin is present. FIGS. 6A-6C are shown at a magnification of 250 times, and have been taken at an electron beam accelerating voltage of 15.0 kV. Numerals indicated at an upper part of FIG. 6A represent a gray scale of the SEM secondary electron image and the gray scale indicated with numerals at upper parts of FIGS. 6B and 6C represent atomic percentages of elements C (carbon) and Sn (tin), respectively, on the observed face. Incidentally, FIGS. 6A-6C can be observed as color pictures and the atomic % can be recognized not by a gray scale but as a color change, at the time of actual measurement.

In FIGS. 6A-6C, the region where much tin is observed with almost no C, represents a region (region a) where the first electrode layer 15A of the LED chip 10 and the first light-transmissive electroconductive layer 25A (represented by the light-transmissive electroconductive filler ITO contained therein) contacted directly with each other. Here, the tin observed in FIG. 6C shows that the light-transmissive electroconductive filler containing tin in the layer 25A was transferred to the first electrode layer 15A at the time of peeling between the first electrode layer 15A and the first light-transmissive electroconductive layer 25A. These results show that a good electrical connection was established between the first electrode layer 15A and the first light-transmissive electro-conductive layer 25A of the LED chip 10.

In FIGS. 6A-6C, the region where much carbon is observed with almost no tin on the first electrode layer 15A of the LED chip 10, represents a region (region b) where the light-transmissive elastomer layer 30 enters between the first electrode layer 15A of the LED chip 10 and the first light-transmissive electroconductive layer 25A to mechanically join the first electrode layer 15A and the first light-transmissive electroconductive layers 25A of the LED chip 10. Thus, it has been found because of the co-presence of the region a and the region b that, in the light-emitting device of the present invention, an electrical connection and mechanical junction are both satisfactorily maintained between the first electrode layer 15A and the first light-transmissive electroconductive layer 25A of the LED chip 10.

Moreover, although an unevenness finer than unevenness 45 of the surface of the electrode layer 15A is usually present on the surface of the electrode layer 15B of the LED chip 10, the light-transmissive elastomer layer 30 is formed also in the minute gap space between the minute surface unevenness of the electrode layer 15B and the surface of the light-transmissive electro-conductive layer 25B of the light-transmissive electroconductive member 20B. Furthermore, on the electrode-layer 15B side, the light-transmissive elastomer exists abundantly near the center of the electrode layer, and, as for an electrode peripheral part, there is clearly observed a trace that the electrode and the light-transmissive electroconductive layer touched directly with each other. Thus, if the light-transmissive elastomer layer 30 is formed also in the minute crevice space on the surface of the light-transmissive electroconductive layer 25B and the light-transmissive elastomer is also present in the other region, the light-transmissive electroconductive layer 25B of the light-transmissive electroconductive member 20B is less liable to be cracked, and the electrode layer 15 of the LED chip 10 and the light-transmissive electroconductive layer 25B of the light-transmissive electroconductive member 20B are bonded firmly, so that an electrical connection and therefore a lighting state are firmly kept even under severe bending and application of a thermal cycle.

The present inventor peeled the light-transmissive electroconductive members apart from the LED chips of the light-emitting devices and measured an areal percentage of a region on an LED electrode where a carbon atomic % is at least 50% with respect to the area of the LED electrode after the peeling based on planar carbon analysis according to the EDX observation (hereafter called an "elastomer coverage (on an LED electrode)" and a measuring method therefor is described later). As a result, the present inventor has found that good electrical connection and mechanical junction are realized when the elastomer coverage is 10-90%, preferably 20-80%, both on the LED electrodes 15A and 15B, and also has found a solution for realizing the condition.

The light-transmissive elastomer layer 30 is a layer of an elastomer having a light-transmissivity but no electroconductivity, and has a total light transmittance of 1 to 99%, preferably 5 to 90%.

The Vicat softening temperature (of which the measuring method is mentioned later) of the elastomer for the light-transmissive elastomer layer 30 is preferably 80° C. to 160° C., more preferably 100° C. to 140° C. Moreover, the tensile storage modulus of the elastomer for the light-transmissive elastomer layer 30 is in the range of preferably 0.01 to 10 GPa, more preferably 0.1 to 7 GPa, respectively between 0 to 100° C.

It is preferred that the elastomer used for the light-transmissive elastomer layer 30 does not melt at the Vicat softening temperature, and shows a tensile storage modulus at the Vicat softening temperature of at least 0.1 MPa, and a melting temperature which is at least 180° C., more preferably 200° C. or more, or is higher than Vicat softening temperature by at least 40° C., more preferably by 60° C. or more. The glass transition temperature of the elastomer used for the light-transmissive elastomer layer 30 is preferably at most −20° C., more preferably −40° C. or below.

An elastomer is an elastic polymer material and is a resin. The elastomer used here is a thermoplastic elastomer as is understood from the fact that it has a Vicat softening temperature. It is a polymer which shows rubber elasticity, e.g. around room temperature and shows thermoplasticity at higher temperatures. Thermoplastic elastomer can be of a type which is polymerized on temperature increase up to a curing temperature and has thermoplasticity thereafter. The production process of the light-emitting device according to an embodiment of the present invention is characterized in that such a thermoplastic elastomer sheet in a state of being inserted between the LED chip electrode and the electroconductive layer is subjected to a vacuum press at a temperature which is equivalent to or slightly above the Vicat softening point and below the melting temperature, thereby deforming the elastomer sheet without causing excessive plasticity or flowing to fill the gaps between the LED chip electrode and the electroconductive layer and improve the bonding (peeling prevention) and electric connection between the LED chip electrode and the electroconductive layer.

Examples of the elastomer used for the light-transmissive elastomer layer 30, may include an acrylic elastomer, an olefinic elastomer, a styrene-based elastomer, an ester-based elastomer, a urethane-base elastomer, etc.

It is possible to contain another resin component, filler, additive, etc., if needed.

In order to improve the filling effect of the elastomer in the product light-emitting device and to secure a contact between the LED chip electrode and the electroconductive layers, it is desirable that the thickness of the light-transmissive elastomer layer 30 is equal to or below the thickness of the LED chip 10. The light-transmissive elastomer layer 30 may have an upper limit thickness which is preferably smaller by at least 5 µm, more preferably smaller by at least 10 µm, still more preferably smaller by at least 20 µm, than the thickness (height) of the LED chip 10. Moreover, the light-transmissive elastomer layer 30 may have a lower limit thickness which is usually ½, preferably ⅗, of the thickness of the LED chip 10.

Here, the thickness of the light-transmissive elastomer layer 30 refers to a thickness of the light-transmissive elastomer layer 30 measured at a part which is separated 100 µm or more from the peripheral wall of the LED body 11 of the LED chip 10 and, in a region between the neighboring LEDs, a thickness of the light-transmissive elastomer layer 30 at a thinnest part between the LEDs. This thickness usually does not differ substantially from the total thickness of a pair of elastomer sheets disposed over the upper and lower faces of the LED chip before the vacuum pressing.

<Production Process>

A production process for the light-emitting device 1 (FIG. 1) is explained with reference to FIG. 7.

For production of a light-emitting device 1, light-transmissive-elastomer sheets 35 are placed between electrode layers 15 of an LED chip 10 and light-transmissive electroconductive layers 25 of light-transmissive electroconductive members 20, and a preliminary press is performed at a weak pressure, to form a temporary laminate. Then, a working environment is evacuated to a vacuum. In such a vacuum environment, the temporary laminate is pressure-bonded at a temperature (Tp) which is lower by at most 10° C. and higher by at most 30° C., preferably by at most 20° C., than the Vicat softening point (Tv) of the light-transmissive elastomer (i.e., Tv−10° C.≦Tp≦Tv+30° C., more preferably Tv−10° C.≦Tp≦Tv+20° C.).

In addition, the tensile storage modulus at the Vicat softening temperature of the elastomer used for the light-transmissive elastomer layer 30, is desirably at least 0.1 MPa, more preferably at least 1 MPa, e.g. 1 MPa-1 GPa.

Moreover, the tensile storage modulus at the heat pressure-bonding temperature of the elastomer used for the light-transmissive elastomer layer 30, is desirably at least 0.1 MPa, more preferably at least 1 MPa, e.g. 1 MPa-1 GPa.

The desirable ranges for the Vicat softening temperature, the tensile storage modulus at the hot pressure-bonding temperature and other parameters described above also hold true with other embodiments disclosed herein.

[Lamination and Vacuum Hot Pressing]

Figure 7:
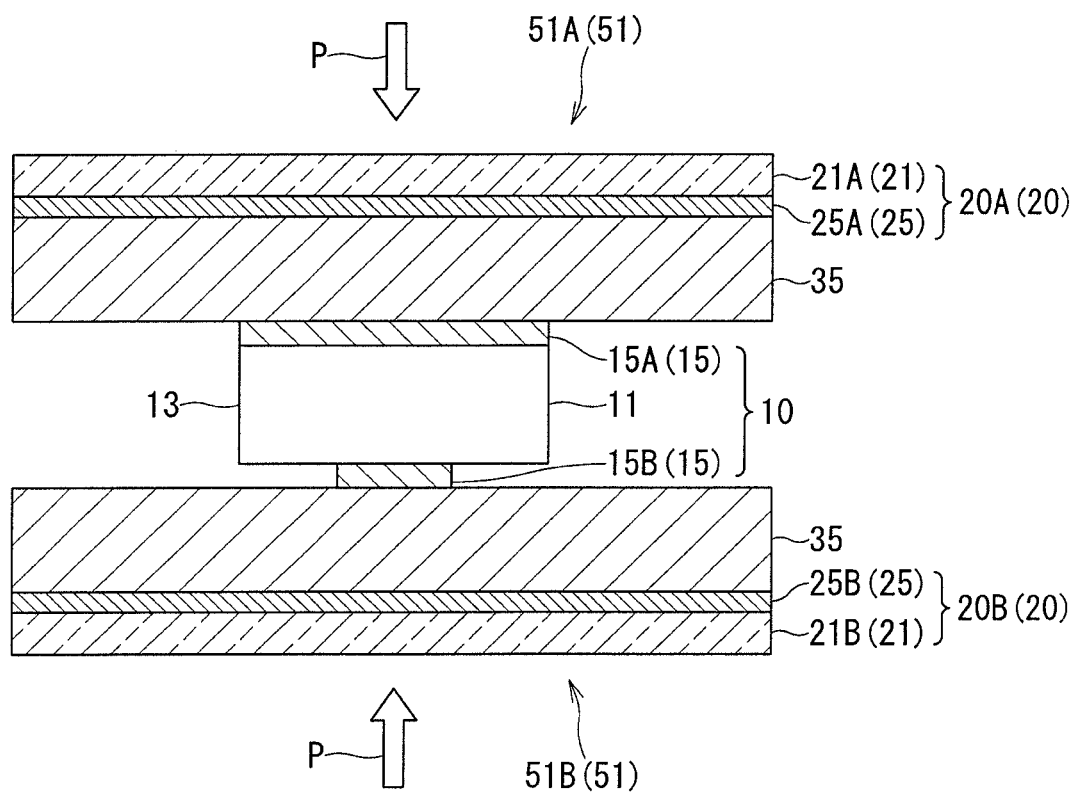
FIG. 7 illustrates a production process for a light-emitting device of a first embodiment.

More specifically, with reference to FIG. 7, a light-transmissive-elastomer sheet 35 of a predetermined thickness is disposed on a light-transmissive electroconductive layer 25B of a light-transmissive electroconductive member 20B so as to cover the entirety of the light-transmissive electroconductive layer 25B, and one or more LED chips 10 are arranged at predetermined position and in a predetermined direction on the light-transmissive-elastomer sheet 35 so as to provide a desired display pattern in a resultant light-emitting device. Further thereon, a light-transmissive-elastomer sheet 35 of a predetermined thickness is disposed, and thereon, a light-transmissive electroconductive member 20A is disposed at a predetermined position while directing its light-transmissive electroconductive layer 25A downward. The light-transmissive-elastomer sheet has a shape which covers the entirety of the light-transmissive electroconductive layer 25A. The above-described order of lamination can be reversed upside down.

Next, the resultant laminate is subjected to a preliminary press, and the working environment is made vacuum. In such a vacuum atmosphere, pressing is performed for a predetermined period of, e.g. 20 to 60 minutes while heating the laminate. The heating temperature for the vacuum hot pressing is, e.g. usually 80-180° C., preferably 100-160° C. The degree of vacuum (absolute pressure) for the vacuum hot pressing is, e.g. usually at most 10 kPa, preferably 5 kPa or less. The pressure applied for the vacuum hot pressing is, e.g. usually 0.5-20 MPa (5-200 kgf/cm$^2$), preferably 0.6-12 MPa (6-120 kgf/cm$^2$).

As a result, the light-transmissive-elastomer sheets 35 in the laminate are softened to envelope the LED chip 10 while preventing the crack or fracture due to pressurization of the light-transmissive electroconductive layers, and the softened light-transmissive elastomer layers are bonded and unified with each other to form a light-transmissive elastomer layer 30. Simultaneously therewith, the electrodes of the LED chip and the light-transmissive electroconductive layers mutually contact and take electric connection with each other. Vacuum hot pressing is performed so that the thickness of the light-transmissive elastomer layer 30 may become smaller than the thickness of the LED chip 10. At the end of the vacuum hot pressing, a light-emitting device 1 as shown in FIG. 1 is obtained.

During the vacuum hot pressing, stress is locally added to the light-transmissive electroconductive layers 25 of the light-transmissive electroconductive members 20 as they contact the electrode layers 15 of the LED chip 10. More specifically, a thrust from the convexities 47 of the electrode layer 15A of the LED chip 10 is added to the light-transmissive electroconductive layer 25A of the light-transmissive electroconductive member 20A, as shown in FIG. 2. Moreover, the light-transmissive electroconductive layer 25B of the light-transmissive electroconductive member 20B receives a thrust from convexities constituting the unevenness 45 on the electrode layer 15B of the LED chip 10 and a thrust from the angle part 18 of the electrode layer 15B of the LED chip 10.

However, when the elastomer laminate shown in FIG. 7 is pressed in the direction of arrows P, the crevice space or gap 48 (FIG. 2) between the surface of the electrode layer 15 (15A, 15B) of the LED chip 10 and the light-transmissive electroconductive layer 25 (25A, 25B) of the light-transmissive electroconductive member 20 (20A, 20B) is filled up with the light-transmissive elastomer layer 30 formed with the softened elastomer sheets 35, so that the occurrence of crack and fracture of the light-transmissive electroconductive layer 25 of the light-transmissive electroconductive member 20 possibly caused by the thrusts from the convexities of the unevenness 45 on the surface of the electrode layer 15 (15A, 15B) of the LED chip 10, is suppressed.

Moreover, the light-transmissive electroconductive layer 25 (25A, 25B) of the light-transmissive electroconductive member 20 comprises light-transmissive-electroconductive-filler particles and a light-transmissive resin binder for binding light-transmissive-electroconductive-filler particles while keeping mutual contact between the adjacent particles, and has flexibility or followability to deformation. For this reason, even if local thrust is applied to the light-transmissive electroconductive layer 25 of the light-transmissive electroconductive member 20 from the convexities 47 of the electrode layer 15A of the LED chip 10, or from the angle part 18 of the electrode layer 15B, a fatal crack in the light-transmissive electroconductive layer 25 is hardly caused and, even if a crack arises, a lighting state can be maintained, since the electric connection reliability of the light-transmissive electroconductive layer is high owing to the presence of the light-transmissive resin binder. Further, the resultant light-emitting device 1 hardly causes a fatal crack when it is severely bent and, even if a crack arises, a lighting state can be maintained, since the light-transmissive resin binder maintains the electric connection of the light-transmissive electroconductive layer.

The control the above-mentioned elastomer coverage in a desirable range may be achieved to some extent by appropriately controlling the total thickness of the light-transmissive elastomer layers 35 within the range of, e.g. 40 to 99%, preferably 60 to 85%, of the thickness (height) of the LED chip 10, but in addition thereto, it is desirable to adjust the shape, material and cushioning properties of the press machine surface contacting the light-transmissive electroconductive member 20 during the vacuum hot pressing, and the conditions of the vacuum hot pressing, such as temperature, pressure and timing. The combination of concrete conditions can be suitably chosen depending on the design of a light-emitting device, and the design of vacuum hot pressing apparatus.

The local intrusion or penetration of the light-transmissive elastomer layer 30 between the electrode layer 15 of the LED chip 10 and the transparent electroconductive layer 25, may be performed by methods other than above-mentioned manufacturing process, such as a method of disposing granular or pillar-shaped light-transmissive elastomer of a suitable size on the electrode layer 15 of the LED chip 10, followed by a step of vacuum hot pressing; and a method of applying or spraying the emulsion of light-transmissive-elastomer powder on the transparent electroconductive layer 25 or the electrode layer 15 of the LED chip 10, followed by drying thereof and vacuum hot pressing, and the production process is not limited to the above-mentioned process. However, in view of the ease of production, the above-mentioned production process is excellent.

[Effect of the Production Process]

According to the production process, the light-emitting device 1 is easily producible. Moreover, since the LED chip 10 is sandwiched by the light-transmissive elastomer layers 35, the LED chip 10 can be reliably fixed for the production.

<Function>

The function of the light-emitting device 1 is explained.

In the light-emitting device 1, the light-transmissive elastomer layer 30 is formed also in the crevice space 48 between the concavities 46 of the unevenness 45 on the surface of the electrode layer 15 (15A, 15B) of the LED chip 10, and the surface 26 of the light-transmissive electroconductive layer 25 (25A, 25B) of the light-transmissive electroconductive member 20 (20A, 20B), so that the light-transmissive electroconductive layer 25 (25A, 25B) hardly causes a crack or a fracture, even if the convexities 47 of the unevenness 45 on the surface of the electrode layer 15 (15A, 15B) of the LED chip 10 abut onto the surface 26 of the light-transmissive electroconductive layer 25 (25A, 25B) of the light-transmissive electroconductive member 20 (20A, 20B). As a result, the electric connection reliability of the light-transmissive electroconductive layer becomes high, so that a lighting state can be maintained, even if the light-emitting device 1 is bent severely or subjected to a thermal cycle.

Moreover, in the light-emitting device 1, the light-transmissive elastomer layer 30 is formed also in the crevice space 48 between the concavities 46 of the unevenness 45 on the surface of the electrode layer 15 (15A, 15B) of the LED chip 10, and the surface 26 of the light-transmissive electroconductive layer 25 (25A, 25B) of the light-transmissive electroconductive member 20 (20A, 20B), so that a positional deviation is hardly caused in the direction of extension of the boundary between the electrode layer 15 of the LED chip 10, and the light-transmissive electroconductive layer 25 of the light-transmissive electroconductive member 20. For this reason, the electric reliability of the light-emitting device 1 is high.

Furthermore, since the light-transmissive electroconductive layer 25 of the light-emitting device 1 is formed by binding a multiplicity of light-transmissive electroconductive fillers with a light-transmissive resin binder, the light-transmissive electroconductive layer 25, as a whole, shows a flexural resistance or followability to deformation. Thus, even when the light-transmissive electroconductive layer 25 is bent along with an edgy part, such as an angle portion of the electrode layer 15, the light-transmissive resin binder portion binding a light-transmissive electroconductive filler bends or deforms, so that the light-transmissive electroconductive layer 25 is rich in followability to such an edgy part like an angle portion of the electrode layer 15. For this reason, when the light-transmissive electroconductive layer 25 is severely bent along with an edgy part, such as an angle part of the electrode layer 15, e.g. during production of the light-emitting device 1, a fatal crack hardly occurs in the light-transmissive electroconductive layer 25 so that lighting ability is maintained by retaining electric connection of the light-transmissive electroconductive layer with the light-transmissive resin binder. Incidentally, although the unevenness 45 is shown only on the electrode layer 15A of the LED chip 10 in FIG. 2, similar unevenness is actually present also on the electrode layer 15B.

<Comparative Manufacturing Processes>

The production process according to this embodiment is characterized by the features that (1) for providing an electric connection between the LED electrode layer 15 and the light-transmissive electroconductive layer 25, an elastomer sheet 35 that does not melt or have a low viscosity (meant herein to assume a tensile storage modulus less than 0.1 MPa) during the vacuum hot pressing step is inserted between the LED electrode 15 and the light-transmissive electroconductive layer 25, and (2) the laminate including the light-transmissive electroconductive member 20, the elastomer sheet 35 and the LED chip 10, is subjected to vacuum hot pressing.

[A Manufacturing Process Wherein Vacuum Hot Pressing is Performed Without Inserting an Elastomer Between an LED Electrode and a Light-Transmissive Electroconductive Member]

An example of production not satisfying the feature (1) performed by the present inventor is explained.

Figure 8:
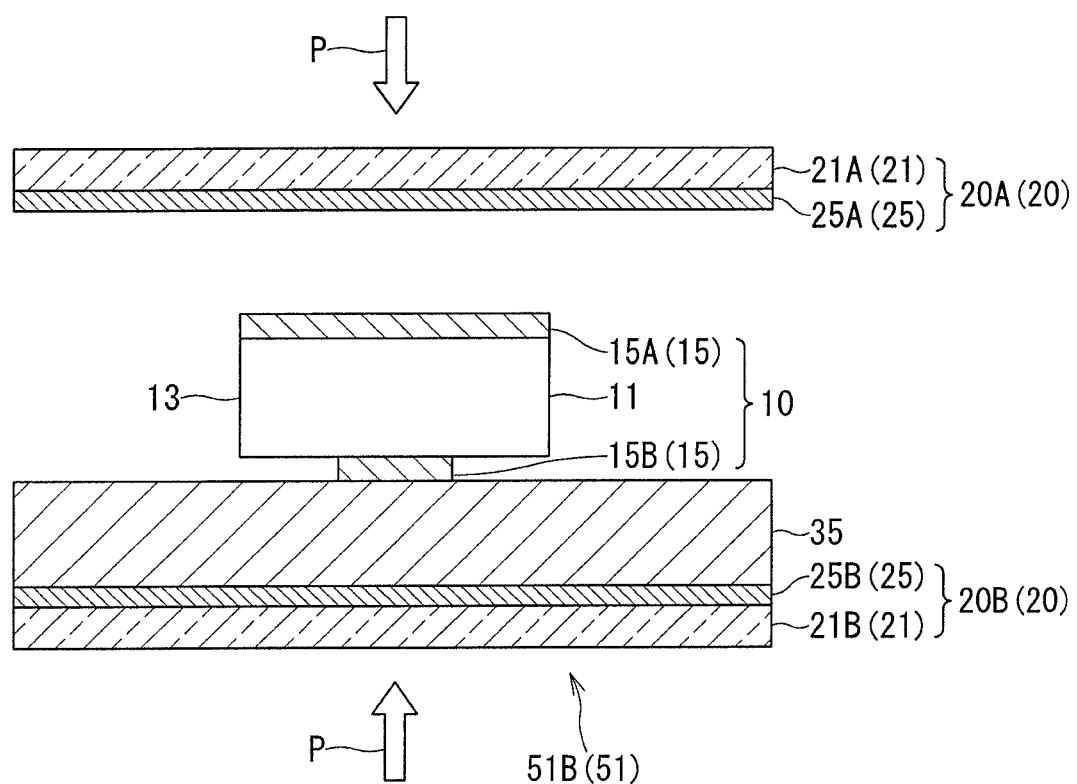
FIG. 8 illustrates Production Example 1 for a light-emitting device.

FIG. 8 illustrates Production example 1 for a light-emitting device which was performed by forming a laminate consisting of light-transmissive electroconductive members 20, an elastomer sheet 35 and an LED chip 10 without inserting a light-transmissive-elastomer sheet 35 between the electrode layer 15A of the LED chip, and the light-transmissive electroconductive layer 25A, and subjecting the resultant laminate to vacuum hot pressing, otherwise in a similar manner as in the above-mentioned first embodiment for production of the light-emitting device 1.

Figure 9:
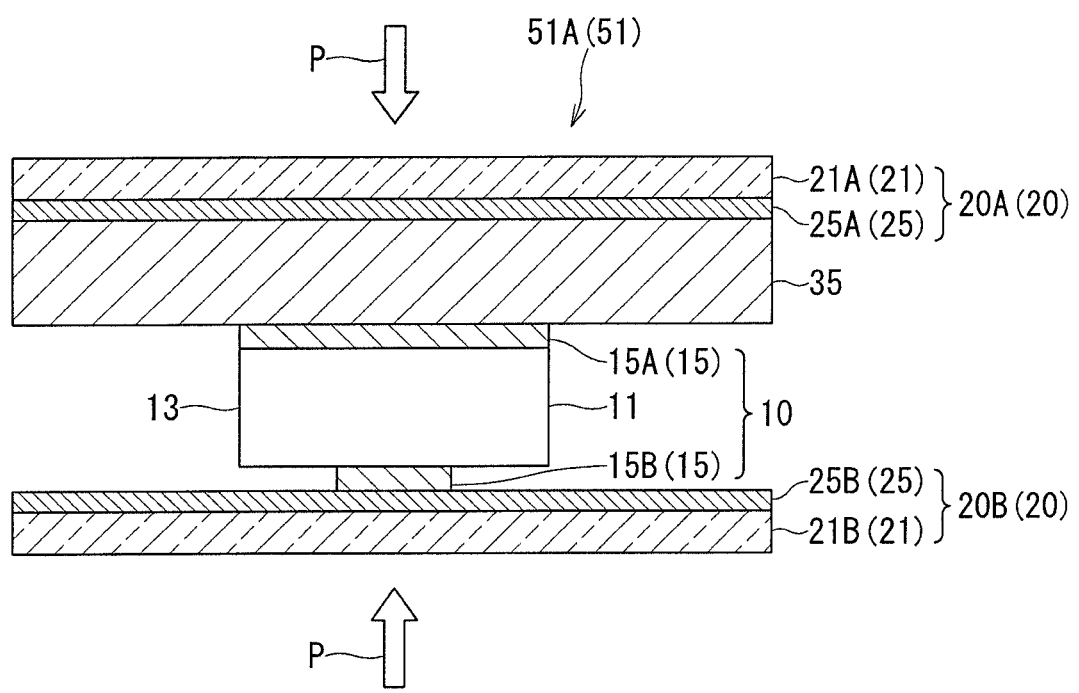
FIG. 9 illustrates Production Example 2 for a light-emitting device.

FIG. 9 illustrates Production example 2 for a light-emitting device which was performed by forming a laminate consisting of light-transmissive electroconductive members 20, an elastomer sheet 35 and the LED chip 10 without inserting a light-transmissive-elastomer sheet 35 between the electrode layer 15B of an LED chip, and the light-transmissive electroconductive layer 25B, and subjecting the resultant laminate to vacuum hot pressing, otherwise in a similar manner as in the above-mentioned first embodiment for production of the light-emitting device 1.

A light-emitting device 90 produced by Production example 1 and a light-emitting device 90A produced by Production example 2 are explained below.

Figure 10:
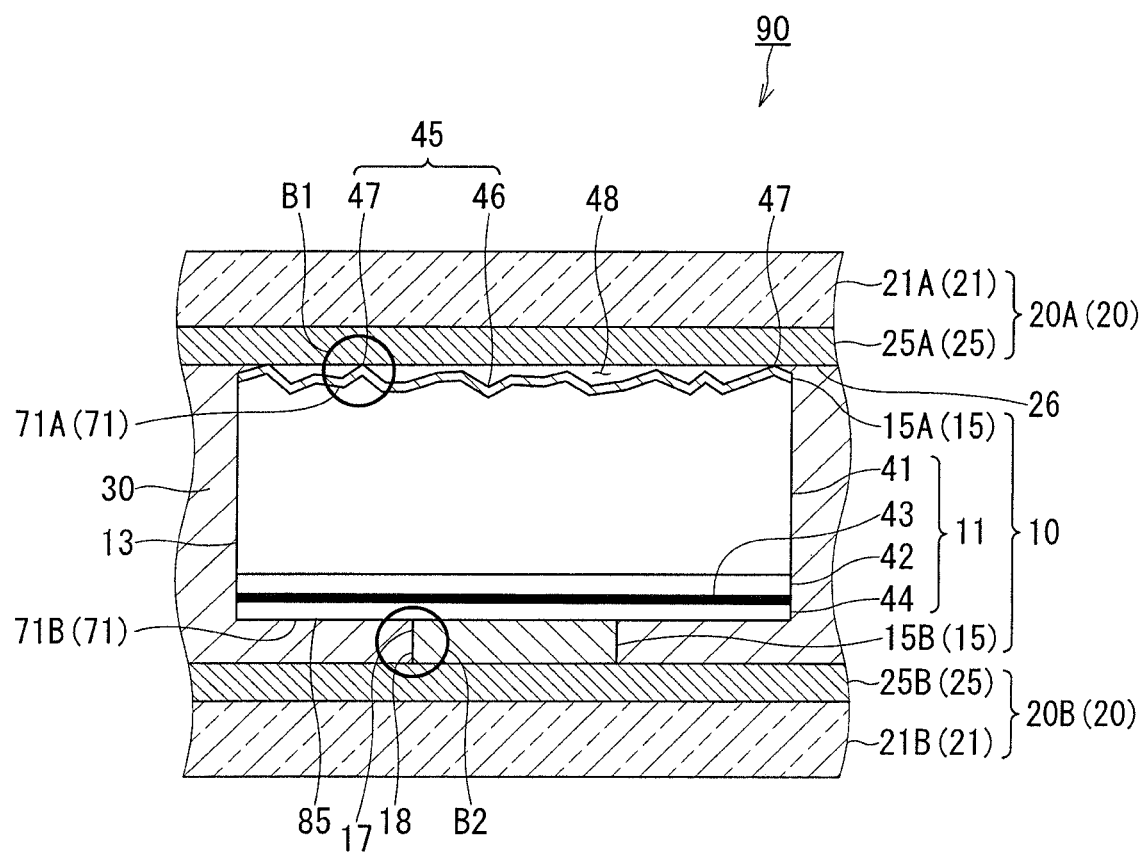
FIG. 10 is a partial enlarged sectional view of a light-emitting device 90 prepared by Production Example 1.
Figure 11:
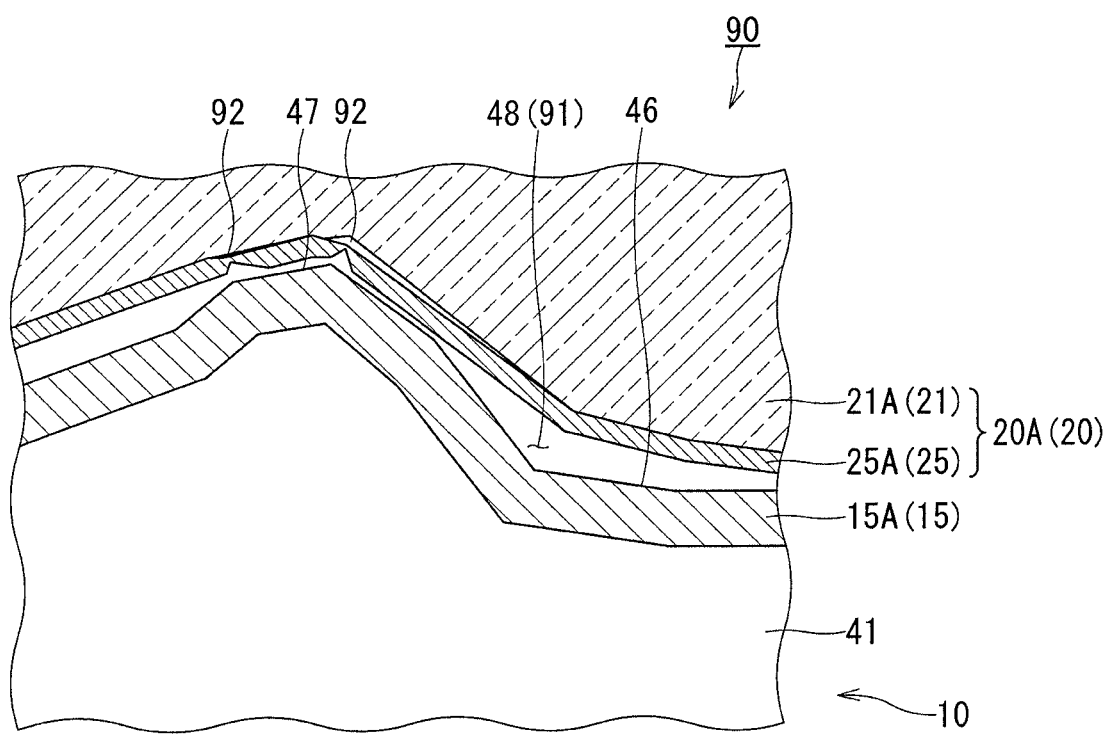
FIG. 11 is a partial enlarged view of a part B1 in FIG. 10.
Figure 12:
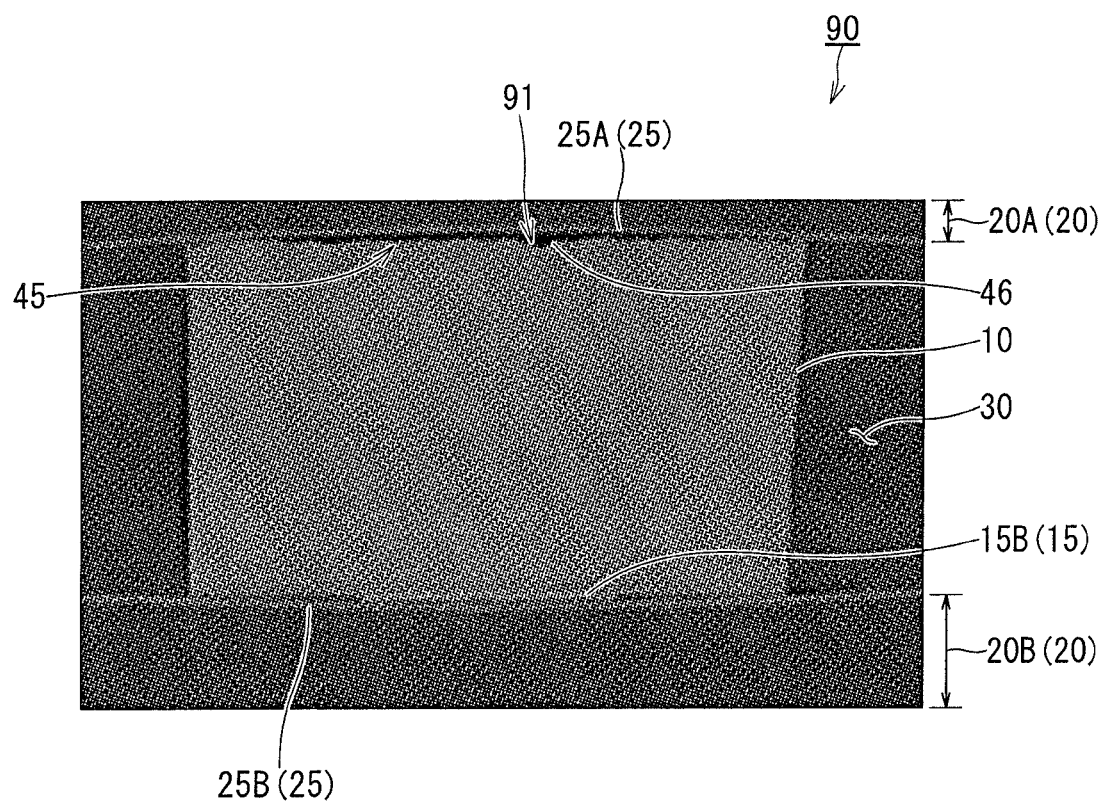
FIG. 12 is a cross-sectional photograph of a light-emitting device 90 prepared by Production Example 1.
Figure 13:
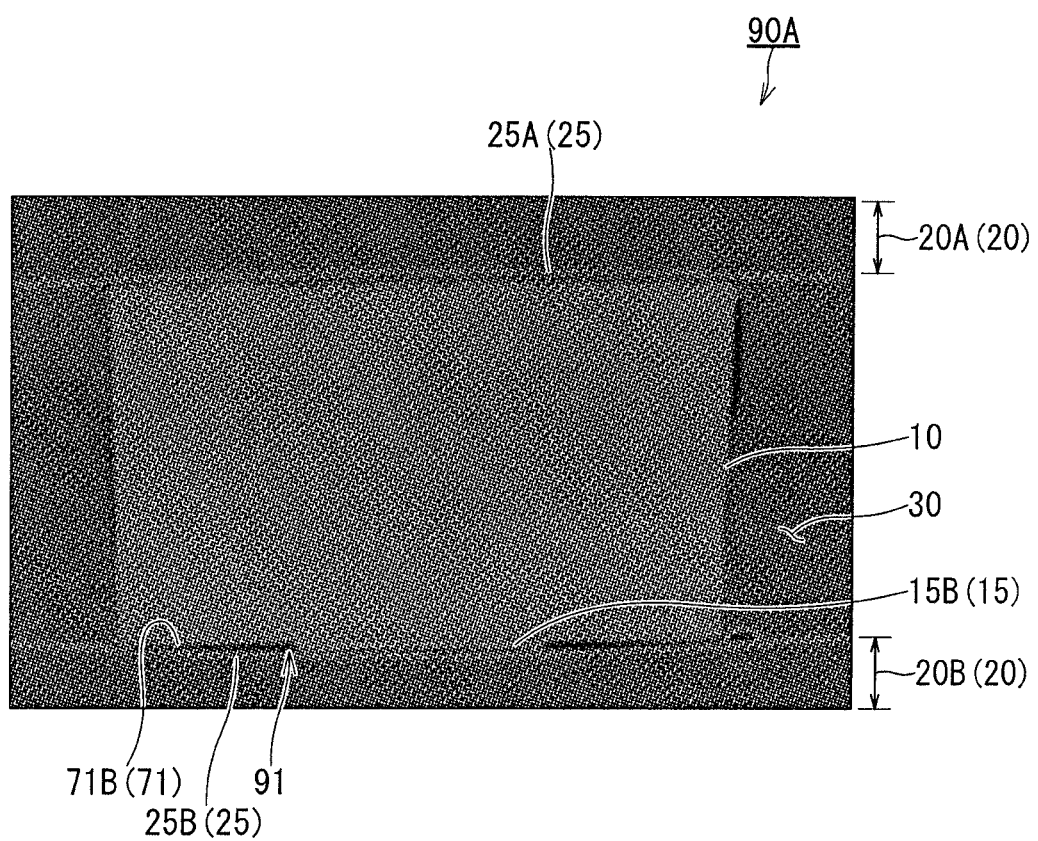
FIG. 13 is a cross-sectional photograph of a light-emitting device 90A prepared by Production Example 2.

FIG. 10 is a partial enlarged view of a section of the light-emitting device 90 produced by Production example 1. FIG. 11 is a partial enlarged view of section B1 in FIG. 10. FIG. 12 shows an example of cross-sectional photograph of the light-emitting device 90 of the light-emitting device 90 produced by Production example 1. FIG. 13 shows an example of cross-sectional photograph of the light-emitting device 90A produced by Production example 2.

(Luminescent Device 90 of Production Example 1)

As shown in FIG. 10-FIG. 12, in the light-emitting device 90 obtained by Production example 1, the crevice gap 48 formed between the concavity 46 of the unevenness 45 of the surface of the electrode layer 15 of the LED chip 10 and the surface 26 of the light-transmissive electroconductive layer 25A of the light-transmissive electroconductive member 20A serves as a vacant gap 91, and the light-transmissive elastomer 30 is hardly present there. Thus, the elastomer coverage was clearly below 10%.

As a result of a bending resistance test and a thermal cycling test, the light-emitting device 90 readily caused a lighting failure. As shown in FIG. 11, a crack 92 was caused at a part, of the light-transmissive electroconductive layer 25A of the light-transmissive electroconductive member 20A, abutting the convexity 47 of the electrode layer 15A of the LED chip 10. This is presumably because the stress from the convexity 47 concentrated under severe bending, leading to the lighting failure under application of bending and thermal cycles.

(Second Light-Emitting Device 90A of Production Example 2)

FIG. 13 is a scanning electron microscope photograph of a section of a laminate after vacuum hot pressing of the laminate consisting of the light-transmissive electroconductive member 20, the elastomer sheet 35 and the LED chip 10 without inserting the light-transmissive elastomer sheet 35 between the electrode layer 15B of an LED chip and the light-transmissive electroconductive layer 25B.

As shown in FIG. 13, in the light-emitting device 90A, there occurred a vacant gap 91 around the electrode layer 15B of the LED chip 10, where almost no light-transmissive elastomer layer 30 was present in the vacant gap 91. Thus, the elastomer coverage was clearly below 10%.

For this reason, as a result of the bending resistance test and thermal cycling test, the light-emitting device 90A readily caused a lighting failure. This is presumably because a crack occurred at a part, of the light-transmissive electroconductive layer 25B of the light-transmissive electroconductive member 20B, abutting the angle part of the electrode layer 15B of the LED chip 10, and the stress from the angle part concentrated under severe bending.

(Luminescent Device According to a Production Process of Patent Document 5)

JP-A 2012-84855 (Patent document 5) discloses a process for producing a light-emitting device, comprising: forming a through-hole in an intermediate layer comprising an acrylic elastomer, disposing a light-emitting element in the through-hole, and sandwiching the front and back faces of the light-emitting element with a pair of supports.

More specifically, there is disclosed a process, wherein an acrylic elastomer sheet having a through-hole therein is placed in contact on a first support, a light-emitting element is disposed in the through-hole, a second support is disposed in contact on the acrylic elastomer sheet, and the resultant laminate is sandwiched and press-heated with a heating drum to produce a light-emitting device.

In the light-emitting device manufactured by this process, a vacant gap 91 occurred around the electrode layer 15 of the LED chip 10, and almost no light-transmissive elastomer layer 30 was present in the vacant gap 91, so that the elastomer coverage was clearly below 10%. Moreover, many air bubbles remained near the LED chip.

In the light-emitting device according to the production process of Patent document 5, although the lighting was generally realized in the initial state, lighting failure was caused as the time passed in many cases. Moreover, lighting failure was readily caused during the bending test and the thermal cycling test.

(Luminescent Device C According to a Production Process of Patent Document 3)

Patent document 3 discloses a process wherein a hot melt adhesive, instead of the light-transmissive elastomer sheet 35, is disposed between the electrode layer 15 of an LED chip and the light-transmissive electroconductive layer 25, and the resultant laminate consisting of the light-transmissive electroconductive member 20, the elastomer sheet 35 and the LED chip 10 is subjected to hot pressing (while melting the hot melt adhesives). The light-transmissive elastomer used in the production process of the present invention is a material which needs to maintain the nature of a light-transmissive elastomer in a vacuum hot pressing step, and is a quite different material from a hot melt adhesive which is a material that melts at a processing temperature and is inapplicable to vacuum hot pressing.

As a result, the light-emitting device C according to Patent document 3 was difficult to manufacture without leaving air bubbles in the light-emitting device including a region between the electrode layer 15 of the LED chip and the light-transmissive electroconductive layer 25, so that a vacant gap not filled with the hot melt adhesive remained between the electrode layer 15 of an LED chip, and the light-transmissive electroconductive layer 25, and also a crack occurred at a part where the light-transmissive electroconductive layer 25 abutted the electrode layer 15 presumably during the pressing. For this reason, in the light-emitting device 90C, lighting failure readily occurred during the bending test or thermal cycling test.

Second Embodiment

Figure 14:
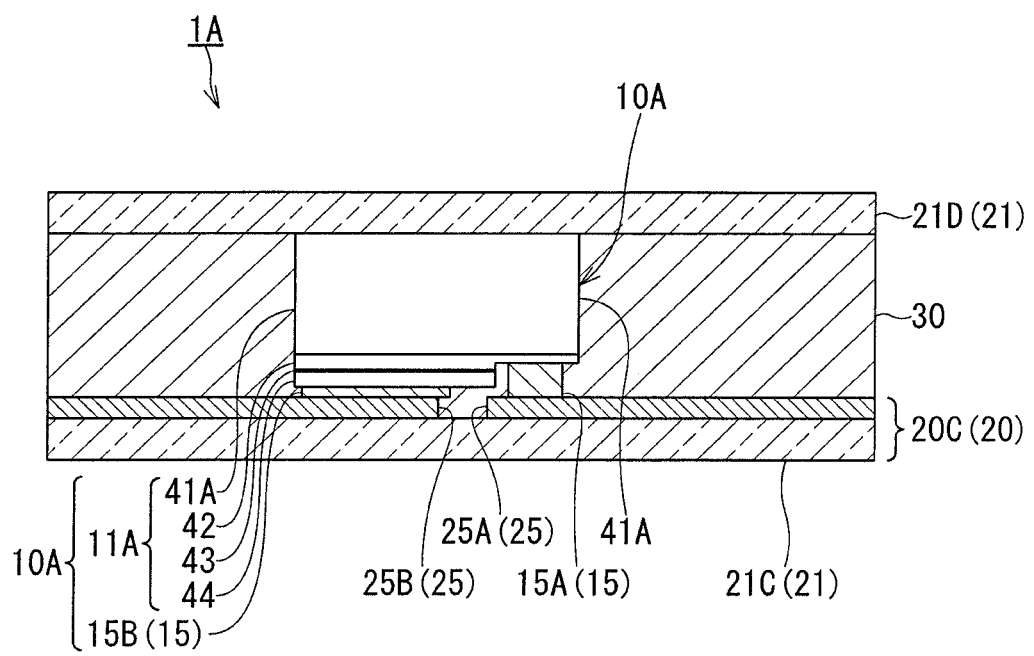
FIG. 14 is a sectional view of a light-emitting device of a second embodiment.

FIG. 14 is a sectional view of a light-emitting device of a second embodiment. Compared with the light-emitting device 1 shown in FIG. 1 as a first embodiment, the light-emitting device 1A is different in that it includes an LED chip 10A having two types of electrodes 15A and 15B on one face thereof in place of the LED chip 10, a transparent substrate 21D having no light-transmissive electroconductive layer 25 in place of the first light-transmissive electroconductive member 20A, and a light-transmissive electroconductive member 20C having two types of light-transmissive electroconductive layers 25A and 25B in place of the second light-transmissive electroconductive member 20B, and the other structure is identical to the light-emitting device 1. Accordingly, with respect to the light-emitting device 1A shown in FIG. 14 as a second embodiment, the same components as those in the light-emitting device 1 shown in FIG. 1 as a first embodiment are denoted by identical symbols or numerals, and further explanations of structure and function are omitted or simplified.

More specifically, the light-emitting device 1A includes: an LED chip 10A having a first and a second electrode layer 15 (15A, 15B) on one face of an LED body 11A; a light-transmissive electroconductive member 20C which includes a transparent substrate 21C and a first and a second light-transmissive electroconductive layer 25 (25A, 25B) formed on the transparent substrate 21C and covers the face having the electrode layers 15 of the LED chip 10A; a transparent substrate 21D covering the other face of the LED chip 10A; and a light-transmissive elastomer layer 30 which consists of an elastomer and is bonded to the circumference 13 of the LED chip 10A, the surface of the light-transmissive electroconductive member 20C, and the surface of the transparent substrate 21D.

In short, the light-emitting device 1A is formed by sandwiching the LED chip 10A with the light-transmissive electroconductive member 20C and the transparent substrate 21D, and bonding the LED chip 10A, the light-transmissive electroconductive member 20C and the transparent substrate 21D with the light-transmissive elastomer layer 30.

<LED Chip>

Figure 15:
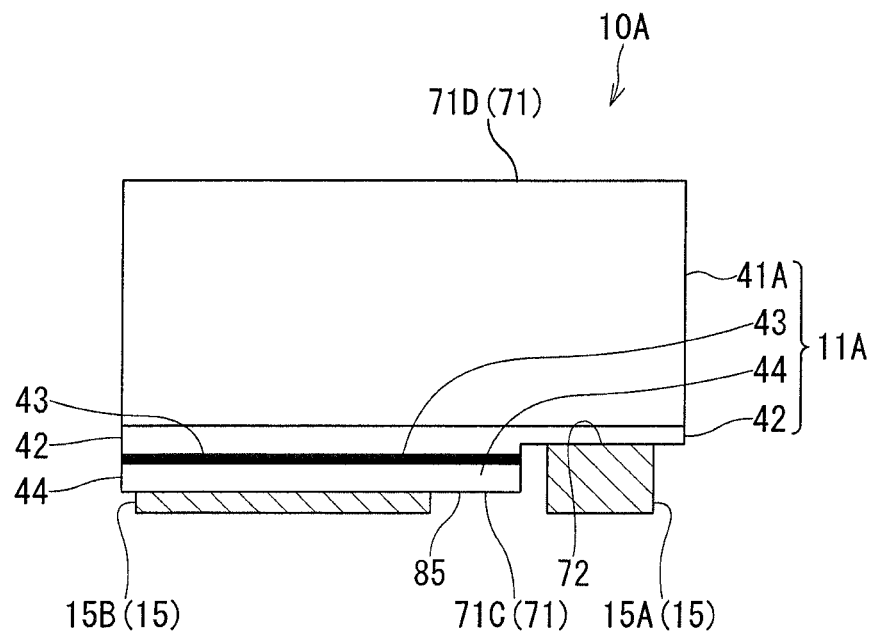
FIG. 15 is a sectional view of an LED chip for a light-emitting device of the second embodiment.

FIG. 15 is an enlarged view of the LED chip 10A shown in FIG. 14.

The LED chip 10A includes the electrode layer 15A as a first electrode layer and the electrode layer 15B as a second electrode layer formed on one face of the LED body 11A.

Compared with the LED chip 10 used in the light-emitting device 1 as the first embodiment, the LED chip 10A differs in that the electrode layer 15A and the electrode layer 15B are formed on one face of the LED body 11A, and the other composition is the same as the latter. Hereinbelow, only the differences between the LED chip 10A and the LED chip 10 are explained.

The LED body 11A has an N-type semiconductor layer 42 and a P-type semiconductor layer 44 on a substrate 41A made of, e.g. a semiconductor or sapphire, a luminescence layer 43 is formed between the N-type semiconductor layer 42 and the P-type semiconductor layer 44.

A face on which the electrode layers 15A (cathode) and 15B (anode) are formed among the faces 71 of the LED body 11A is called a third face 71C of the LED body 11A. In this example, the third face 71C of the LED body 11 is the surface of the P-type semiconductor layer 44. The electrode layer 15B is formed on the third face 71C.

Moreover, a face opposite to the third face 71C of the LED body 11A and having no electrode layer 15A or 15B thereon is called a fourth face 71D of the LED body 11. The fourth face 71D is a surface of the LED substrate 41A. It is possible to dispose a reflective film (not shown) on the surface of the LED substrate 41A, or on the face 71C. It is also possible that the face 71C or the face 71D forms a luminescence face of LED chip 10. In case where the LED substrate 41A is transparent, almost all the faces of the LED chip 10A can be a luminescence face. Light can be taken out from either one face or both faces, and a face close to the luminescence layer 43 is hereafter called a luminescence face herein for convenience.

The electrode layer 15A (cathode), in this example, is formed on and electrically connected to a non-covered and exposed face 72 of the N-type semiconductor layer 42 which is generally covered with the luminescence layer 43 and the P-type semiconductor layer 44. Since the exposed face 72 of the N-type semiconductor layer 42 and the third face 71C of the LED body 11A are disposed in an identical direction as viewed from the center of the LED body 11A, the electrode layer 15A is formed on the luminescence layer-side interface 72 of the N-type semiconductor layer 42 and also disposed on the third face 71C of the LED body 11A.

The electrode layer 15A and the electrode layer 15B may have a thickness (height) of usually 0.1-10 µm, preferably 1-5 µm, and their thicknesses are almost identical but can differ by about 1 µm at the maximum. The electrode layer 15A and the electrode layer 15B are usually formed in a total area which is smaller than that of the face 71C of the LED body 11 so that luminescence may not be obstructed.

A certain degree of unevenness is formed in the exposed face 72 of the N-type semiconductor layer 42 on which the electrode layer 15A is formed. Accordingly, a similar form of unevenness as the unevenness on the face 72 is formed in the surface of the electrode layer 15A formed on the exposed face 72.

The unevenness of the surface of the electrode layer 15A and the electrode layer 15B may respectively give a roughness of preferably at least 0.1 µm. As a result, the surfaces of the electrode layers 15A and 15B may have a higher adhesiveness with the light-transmissive electroconductive member 20C in the light-emitting device of the present invention.

<Transparent Substrate>

The transparent substrate 21D is identical to the transparent substrate 21A constituting the light-transmissive electroconductive member 20A in the first embodiment, so that explanation thereof is omitted.

<Light-Transmissive Electroconductive Member>

The light-transmissive electroconductive member 20C includes a transparent substrate 21C having a flexural resistance, and two types of light-transmissive electroconductive layers 25A and 25B formed on one surface of the transparent substrate 21C. The light-transmissive electroconductive layer 25A is formed so as to be electrically connected to the electrode layer 15A of the LED chip 10A, and the light-transmissive electroconductive layer 25B is formed so as to be electrically connected to the electrode layer 15B of the LED chip 10A.

Compared with the light-transmissive electroconductive member 20B used in the light-emitting device 1 as the first embodiment, the light-transmissive electroconductive member 20C differs in that the light-transmissive electroconductive layer 25A and the light-transmissive electroconductive layer 25B are formed on one surface of the transparent substrate 21C, and the other composition is identical.

The light-transmissive electroconductive layer 25 formed on the light-transmissive electroconductive member 20C, similarly as the light-transmissive electroconductive layer 25 in the first embodiment, may be any form of (1) a conductor thin film, (2) a resin film containing fine particles of light-transmissive conductor dispersed therein, and (3) a mesh electrode. The light-transmissive electroconductive layer 25 formed on the transparent substrate 21C in a form of (1)-(3) above, may be patterned into the electroconductive layer 25A connected to the electrode layer (cathode) 15A on the N-type semiconductor layer 42, or the electroconductive layer 25B connected to the electrode layer (anode) 15B on the P-type semiconductor layer 44, by laser processing, etching processing, etc.

The electrode layers 15A and 15B of the LED chip 10A are formed as so-called "pad electrodes" of a metal conductor, such as Au, and they are electrically connected to the light-transmissive electroconductive layers 25A and 25B, respectively, after positional alignment and vacuum pressing. When the thus-obtained light-emitting device was subjected to repetitive bending, the occurrence of lighting failure was observed. As a result of study thereafter, it was found that the failure was caused when the device in a state as shown in FIG. 14 was bent convex upwards to cause the touching of a front end of the light-transmissive electroconductive layer 25A connected to the electrode layer 15A (cathode) with the electrode 15B (anode), thus causing a cathode-anode short-circuit. Moreover, according to a further study, this inconvenience could be avoided by locally forming a bump electrode of a good conductor, such as Au or Ag, of about 50-100 μm in both diameter and height on each of the pad electrodes 15A and 15B of the LED chip 10A, and connecting the bump electrodes to the light-transmissive electroconductive layers 25A and 25B, respectively. The short circuit prevention effect by formation of such a bump electrode on a pad electrode can be also attained in the first embodiment of using an LED chip having electrodes on both faces thereof by forming such a bump electrode on a pad electrode having a smaller area than LED chip (the anode electrode 15B in the example of FIG. 1).

Figure 17:
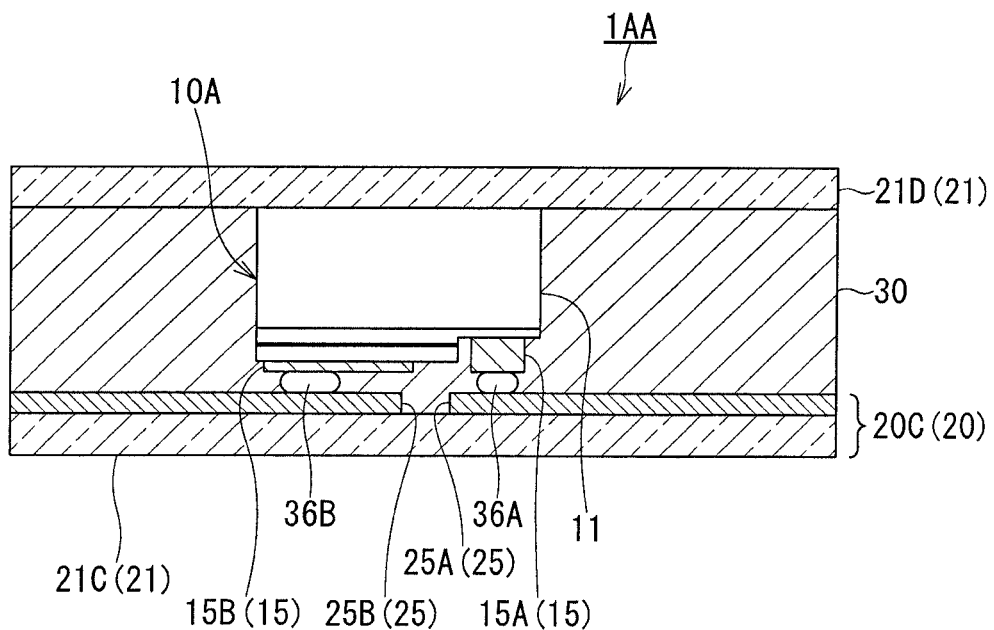
FIG. 17 is a schematic cross section of an example of a one-face electrode-type light-emitting device containing a bump electrode.
Figure 18:
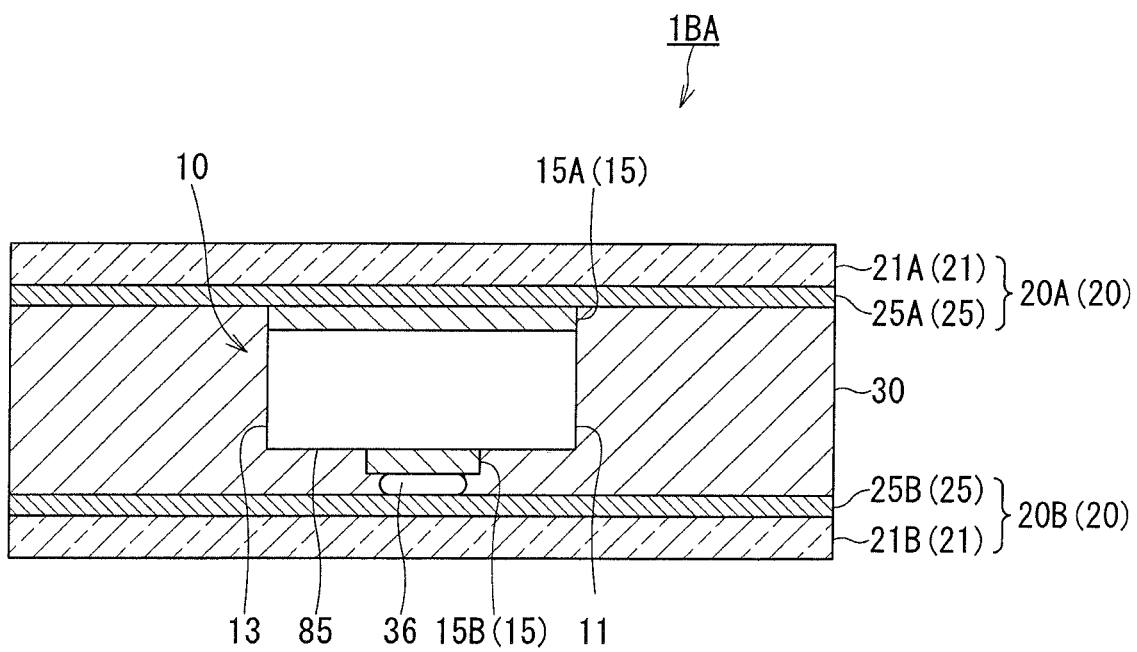
FIG. 18 is a schematic cross section of an example of a two-face electrode-type light-emitting device containing a bump electrode.

FIGS. 17 and 18 are schematic cross sectional views of light-emitting devices 1AA and 1BA which may be prepared by forming such bump electrodes 36A and 36B, and a bump electrode 36, in the light-emitting devices of FIG. 14 and FIG. 1, respectively. Such a bump electrode 36A, 36B or 36 may be formed as follows.

Figure 19:
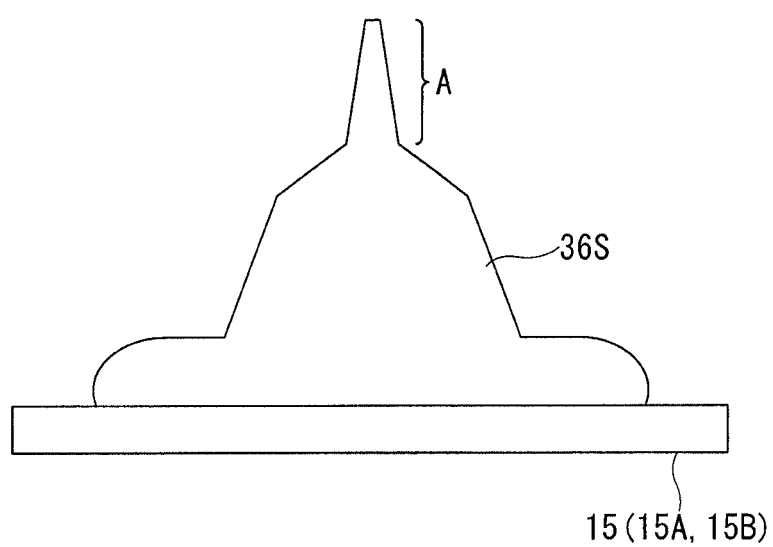
FIG. 19 is a side view showing an example shape of Au bump formed on a pad electrode.

A tip of, e.g. Au wire, is discharged by using a wirebonding apparatus to form an Au bump 36S on a pad electrode 15 (15A, 15B) of an LED chip, e.g. as shown in FIG. 19, the Au bump 36 is preferably pressed to flatten the top A, and then over the LED chip, the above-mentioned light-transmissive electroconductive member 20 (20A, 20B) having the elastomer layer 30 and the electroconductive layer 25 (25A, 25B) formed thereon is superposed in positional alignment with the LED chip, followed by vacuum hot pressing, to provide a light-emitting device having introduced the bump electrodes 36A and 36B (or 36).

Figure 20:
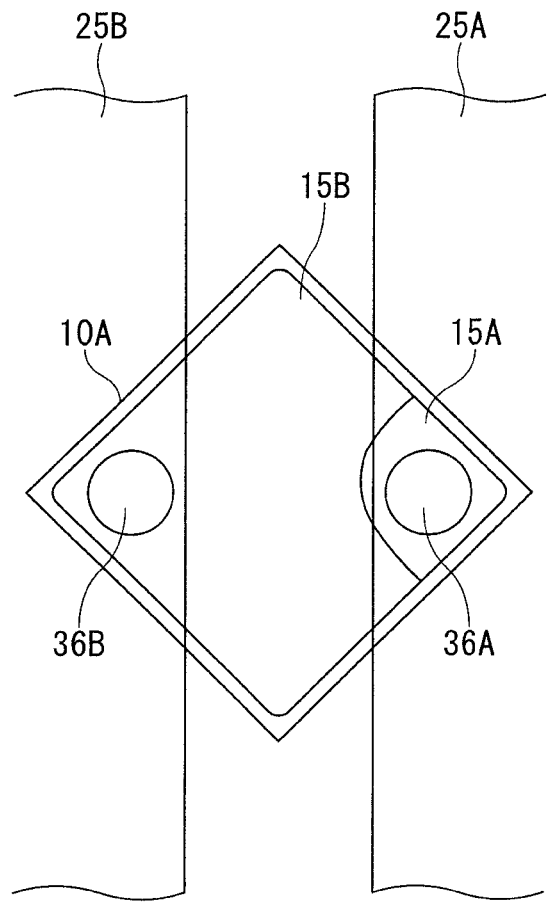
FIG. 20 is a plan view showing an example of disposition of bump electrodes in a one-face electrode-type light-emitting device.

With respect to the light-emitting device shown in FIG. 17 for example, the bump electrodes 36A and 36B, thus introduced, are arranged in relative positions with the pad electrodes 15A and 15B and the electroconductive layers 25A and 25B, e.g. as shown in a plan view of FIG. 20.

<Production Process>

Figure 16:
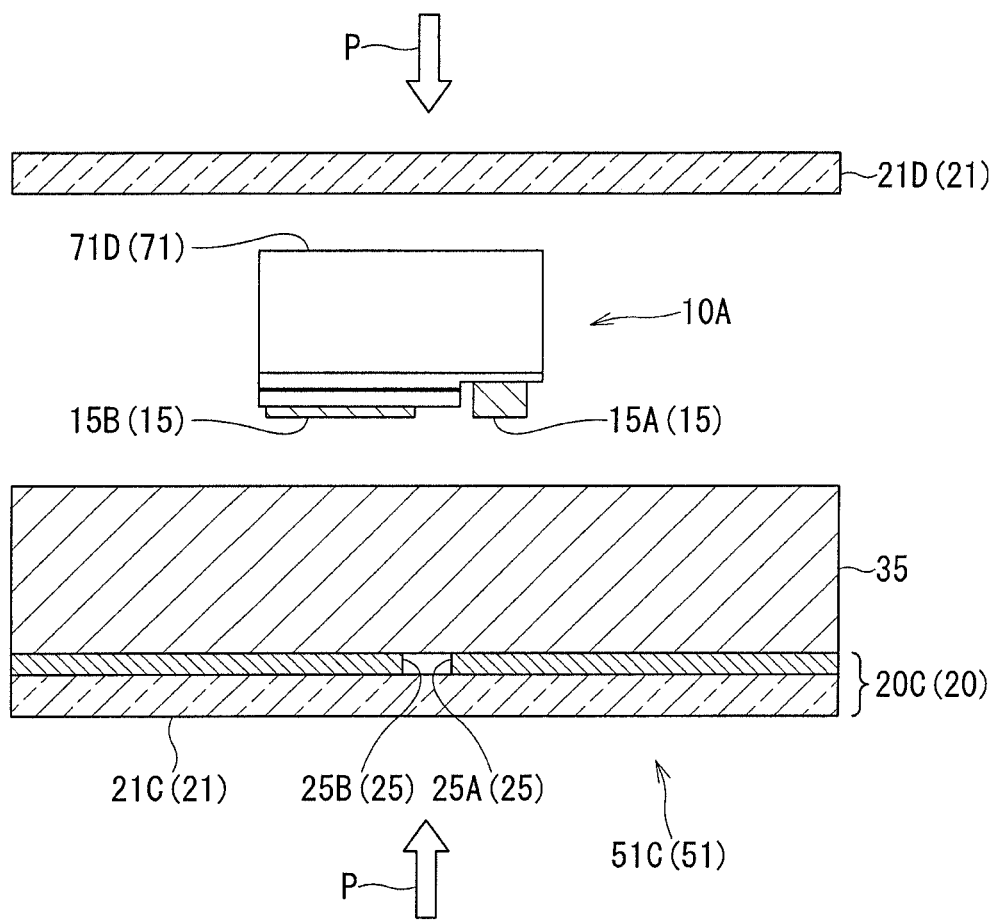
FIG. 16 illustrates a production process for a light-emitting device of the second embodiment.

With reference to FIG. 16, the production process of the light-emitting device 1A is explained.

The light-emitting device 1A having a partial sectional structure schematically shown in FIG. 14, like the light-emitting device 1 shown in FIG. 1 as the first embodiment, is formed through a process of disposing the light-transmissive elastomer sheet 35 between the electrode layer 15 of the LED chip 10A and the light-transmissive electroconductive layer 25 of the light-transmissive electroconductive member 20; and subjecting the resultant laminate to vacuum hot pressing at a temperature in a range between 10° C. below and 30° C. higher than the Vicat softening temperature of the light-transmissive elastomer, thereby joining the LED chip 10A, the light-transmissive electroconductive member 20 and the light-transmissive and insulating substrate 21D, with the above-mentioned light-transmissive elastomer.

As different from the first embodiment, it is sufficient to dispose the light-transmissive elastomer sheet 35 at least between the light-transmissive electroconductive layers 25C and the electrode face of the LED chip and it is not necessary to always insert a light-transmissive elastomer sheet between the transparent substrate 21D and the LED chip. Accordingly, further explanation of a production process is omitted.

According to the scanning electron microscope photograph, the elemental mapping photograph of C by EDX and the elemental mapping photograph of tin by EDC of the surfaces of the electrode layer 15A and 15B after peeling at the boundary between the electrode layers 15A and 15B of the LED chip 10, and the light-transmissive electroconductive members 20C, the surfaces exhibited almost identical states as the surface of the electrode layer 15B in the first embodiment. Especially, both surfaces of the electrode layers 15A and 15B of the LED 10 after peeling between the electrode layers 15A and 15B and the light-transmissive electroconductive member 20C, exhibited much C element and almost no tin element near the surface centers thereof, and conversely, much tin element and almost no C element near the edges of the electrode layers 15 of the LED 10.

These results show that the electrode layer 15 and the light-transmissive electroconductive layer 25 of the LED chip 10A were in a good electrical connection.

Moreover, by existence of the region where a lot of C was present with almost no tin on the surface of the electrode layer 15 of the LED 10, it was shown that there was a region where the light-transmissive elastomer layer 30 entered between the electrode layer 15 of the LED chip 10 and the light-transmissive electroconductive layer 25 to mechanically join the electrode layer 15 of the LED chip 10 and the light-transmissive electroconductive layers 25. Thus, it was understood that good electrical connection and mechanical junction were satisfactorily maintained between the electrode layer 15 of the LED chip 10A and the light-transmissive electroconductive layer 25, also in the light-emitting device of the second embodiment of the present invention.

Also in the second embodiment of the light-emitting device of the present invention, good electric connection and mechanical junction are realized between the electrode layer 15 of the LED chip 10, and the light-transmissive electroconductive member 20 in case where the elastomer coverage of the LED electrode 15A and the LED electrode 15B is, 10% to 90%, more preferably 20% to 80%.

In the second embodiment of the present invention, the production is performed by using an LED 10A on only one face of which the electrode layers 15 (15A, 15B) are formed, the positional alignment between the electrode layers 15 of the LED chip 10A and the light-transmissive electroconductive layers 25 of the light-transmissive electroconductive member 20C is required only one side thereof. For this reason, production is easy and the yield of the light-emitting device 1 becomes high.

By the way, although the above-mentioned embodiments have been illustrated and explained mainly with respect to devices containing one LED chip 10. However, the light-emitting device of the present invention may include a plurality of LED chips 10, and it is rather usual that more than two LED chips 10 are included and arranged according to a desired display pattern.

Moreover, the light-emitting device can include one or more types of semiconductor devices chosen from resistances, diodes, transistors and ICs in addition to the LED chip(s) 10, on the surface(s) of the light-transmissive electroconductive layer(s) 25 of the light-transmissive electroconductive member(s) 20.

<Comparison Between the Light-Emitting Device of the Present Invention and the Conventional Light-Emitting Device>

When the conventional light-emitting device was reexamined during a course of study up to completion of the present invention, the following fact has become clear.

More specifically, it has been found that an edge of an electrode on the surface of a light-emitting element is usually formed so as to provide an almost right angle between its surface opposite to the light-transmissive electroconductive layer of a light-transmissive electroconductive member and its side wall, so that at the time of bending of a light-emitting device or application of a thermal cycle to a light-emitting device, the light-transmissive electroconductive layer of the light-transmissive electroconductive member is pressed and abutted against the edge of the electrode of the surface of the light-emitting element, thus being liable to produce a crack and a breakage. When the crack or breakage occurs in the light-transmissive electroconductive layer, electric connection of a light-transmissive electroconductive layer becomes insufficient, and a light-emitting device causes a lighting failure. This problem occurs not only in production but also in use accompanied with bending or application of thermal cycle to the light-emitting device. Incidentally, the abutment of the light-transmissive electroconductive layer at the time of application of thermal cycle to a light-emitting device is caused by a difference in coefficient of thermal expansion between component materials.

Moreover, a commercially available two-face electrode-type LED is usually provided with an unevenness on the substrate face and accordingly on the surface of the electrode so as to improve the adhesiveness with an electric conduction paste in expectation that the electrode on the non-light-emitting face is joined to a lead frame with the electric conduction paste. Moreover, an electrode surface on a luminescence face may be provided with fine unevenness for preventing total reflection etc. In such a case, if the light-transmissive electroconductive layer of the light-transmissive electroconductive member is abutted to convexities of such unevenness at the time of bending and application of thermal cycle to the light-emitting device, a crack or breakage is liable to occur in the light-transmissive electroconductive layer. When the crack or breakage occurs in the light-transmissive electroconductive layer, electric connection of a light-transmissive electroconductive layer becomes insufficient, and a light-emitting device causes a lighting failure.

Furthermore, in the light-emitting device disclosed in Patent document 5, the thickness of an intermediate layer is smaller than the thickness of a light-emitting element. As a result, the light-transmissive electroconductive layer of the light-transmissive electroconductive member is abutted strongly against the surface edges of the electrode of the light-emitting element at the time of bending of or application of thermal cycle to the light-emitting device and is liable to cause crack or breakage at the abutted parts. If the crack or breakage occurs in the light-transmissive electroconductive layer, electric connection of the light-transmissive electroconductive layer becomes insufficient, and the light-emitting device causes a lighting failure.

Thus, it was found that the conventional light-emitting devices involved a problem that the light-transmissive electroconductive layer of a light-transmissive electroconductive member was liable to cause a crack or breakage at the time of bending and application of thermal cycle and during production. If the crack or breakage occurs in the light-transmissive electroconductive layer, electric connection of a light-transmissive electroconductive layer becomes insufficient, and a light-emitting device causes a lighting failure.

Moreover, for production of conventional light-emitting devices, thermal compression bonding has been performed under atmospheric pressure, so that air bubbles (at a pressure higher than atmospheric pressure) are liable to remain especially around the LED chip in the light-emitting device. For this reason, it has been found that the bubbles swell after the thermal compression bonding to cause poor electric connection and undesirable appearance due to irregular light scattering, etc. due to air bubbles and swelling.

In the light-emitting device disclosed in Patent documents 4 and 5, since the light-transmissive electroconductive layer and the LED electrode are merely physically in contact with each other and with no material having a bonding function therebetween, it has been found impossible to maintain a contact between the light-transmissive electroconductive layer and the LED, when the light-emitting device is bent in curvature radius of less than about 100 mm, and a lighting failure occurs in less than several hundreds of thermal cycles between high and low temperatures.

In the process disclosed in Patent document 3 of performing heat-press bonding of a light-emitting element electrode and a light-transmissive electroconductive layer, after inserting therebetween an electrically insulating adhesive, such as a flexible hot melt adhesion sheet, the hot melt adhesive is heat-melted to be fluidized, intimately contacts the electrodes and the electroconductive layer and solidifies on cooling to exhibit the bonding ability, whereby electric and mechanical contacts between the light-emitting element electrode and the light-transmissive electroconductive layer, can be attained. The hot melt adhesive is, however, melted and pressed for welding, as is clearly described in Patent document 3. As a result, under application of a pressure during production, the light-transmissive electroconductive layer of a light-transmissive electroconductive member is abutted against the edge of an electrode, the surface unevenness of the electrode and a stepwise difference between the substrate of a light-emitting element and the edge of an active layer, etc., so that the light-transmissive electroconductive layer is liable to cause a crack or a breakage which is however not prevented by a hot melt adhesive as described above. Accordingly, it becomes impossible to maintain a lighting state when it is subjected to a thermal cycling test in temperature range of, e.g. −20 to 60° C., or −40° C. to 85° C. usually required of electric parts, or when it is severely bent. In the case of bonding an electrode and an electric conduction circuit layer of an LED chip with an electrically conductive adhesive, it is very difficult to achieve a sufficient insulation between a plurality of LED chips carried and, in order to solve this, there arises a manufacturing cost increase due to complication of a connection step and an increase of involved steps, etc. Moreover, when a conductive adhesive is used, it is difficult to ensure a flexural resistance of the light-emitting device. Furthermore, it has been found that since a hot melt adhesive is melted on heating, it is difficult to perform an adhesion step under vacuum, and there arises a vacant gap (air bubbles) with the residual air in the light-emitting device, to result in poor connection and appearance.

Based on the above-mentioned knowledge, the present invention has been completed in order to solve the problems of the conventional technology.

[Apparatus Including the Light-Emitting Device]

The apparatus of the present invention is equipped with the above-mentioned light-emitting device of the present invention.

Examples of such apparatus suitably equipped with the above-mentioned light-emitting device of the present invention, may include: electronic appliances, such as a television set and a personal computer; electronic display apparatus, such as an exhibition plate and a bulletin board; movable bodies, such as vehicles, a vessel and an airplane, equipped with illumination apparatus or display apparatus including a light-emitting device; a building, works, etc. equipped with illumination apparatus or display apparatus including a light-emitting device.

EXAMPLES

Examples are shown below, whereas the present invention should not be construed as being restricted thereto. Characteristic values and evaluation thereof described in the present specification including the following description are based on methods and standards described below.

<Electrode Surface Roughness Ra>

Ra value was measured as an arithmetic average roughness value measured according to JIS B 0601-2001 with respect to a region of ⅓ or more of the crossing length of an objective electrode.

<Sheet Resistivity of a Light-Transmissive Electroconductive Layer>

Measured by the 4 terminal method based on JIS K 7194 for any of the thin film-type electroconductive layer, the electroconductive powder-dispersed resinous electroconductive layer and the mesh electrode.

<Elastomer Properties>

The following properties were measured for the sheet-form samples to be used.

Vicat softening temperature was measured according to the A50 method of the JIS K7206 (ISO 306) by using a heat distortion tester No. 148-HD-PC (available from Yasuda Seiki Seisakusho Ltd.) under the conditions of a test load of 10N and a heating rate of 50° C./hour.

Glass transition temperature and Melting temperature were measured by performing heat flux differential scanning calorimetry according to JIS K2121 (ISO 3146), using Shimadzu differential scanning calorimeter DSC-60 at a heating rate of 5° C./minute from −100° C. to the heat-absorption peak (melting point).

Tensile storage modulus was measured according to JIS K7244-4 (ISO 6721-4) using an automatic dynamic viscoelasticity meter ("DDV-01GP", available from A&D Co., Ltd.) under the conditions of a constant temperature increase rate of 1° C./minute and a frequency of 10 Hz. Measurement was performed at 0° C., 100° C. and the Vicat softening temperature.

[Characteristic Evaluation of Product Light-Emitting Device (LED Device)]

The following items were evaluated.

<Thickness Between the LED Chips of a Light-Transmissive Insulating Elastomer Layer>

A thickness of a light-transmissive insulating elastomer layer (in a strip-shaped LED device sample with a length of about 90 mm (width: about 50 mm) including 6 LED chips (each having a planar size of 0.3 mm×0.3 mm and a height of 175 μm) arranged in a straight line with a spacing of about 5 mm from each other and connected in series prepared in, e.g. Examples and Comparative Examples described hereafter) in a room at 20° C., was optically measured at a position 1500 μm separated from an end of an LED chip disposed near the center. An arithmetic average of the measured values for 12 sample devices was taken.

<Flexural Resistance>

Flexural resistance test was performed with respect to six of twelve obtained samples of LED devices under a temperature of 20±2° C., a relative humidity of 60 to 70%, and an environment of normal pressure (86-106 kPa).

First, there were provided plural species of cylinders for measurement having radius of 100 mm to 20 mm successively decreasing at a decrement of 10 mm and respectively having a section of a uniform diameter and of a perfect circle.

Next, each strip-shaped LED device was set so that its longitudinal direction formed a right angle with the axis of a measurement cylinder, and so that the back (opposite to the light-emitting face) of an LED chip was disposed along the surface of the measurement cylinder. Then, each LED device was turned on and, in this state, bent at 180 degrees over the surface of the measurement cylinder, to evaluate the lighting state was maintained. This evaluation was performed sequentially from a measurement cylinder with a larger radius to a measurement cylinder with a smaller radius, to record two smallest flexural radiuses including 20 mm (which is evaluated to represent a practically excellent flexural resistance) or alternative smallest radiuses and the number of sample devices having maintained their lighting states at the radiuses.

<Thermal Cycling Test>

The other six obtained LED device samples was subjected to a thermal cycling test according to JIS C60068-14.

More specifically, each strip-shaped LED device disposed in a horizontal state and in a lighting state was subjected to a thermal cycling test in a temperature range of −20° C. to 60° C. including 30 minutes each of standing at −20° C. and 60° C. and intermediate temperature increase and temperature decrease respectively at a rate of 3° C./min. (i.e. 1 cycle of 53.3 minutes), and the number of samples in six samples having maintained the lighting state was recorded, respectively after 2000 cycles, 2500 cycles and 3000 cycles.

(Lighting Conditions)

As for the lighting conditions for the LED device in the above-mentioned flexural resistance and thermal cycling tests, a predetermined direct-current voltage was continuously impressed between both end terminals of each LED device so that a basically fixed current of 6 mA was flowed through 6 LED chips connected in series, and electricity supply conditions were changed as follows.

ITO-dispersed resin film:
 1 μm in thickness: Terminal voltage 25V,
 3 μm in thickness: Terminal voltage 20V,
ITO-sputtered film: Terminal voltage 30V,
Ag grain mesh electrode film: Terminal voltage 20V.

<Appearance and Sectional Observation>

Sampled devices after the preparation were left standing for 24 hours in an environment of temperature of 20±2° C., relative humidity of 60 to 70% and normal pressure (86-106 kPa).

(Observation of Appearance)

Visual examination by viewing with eyes was conducted with respect to light-transmissive LED light-emitting devices before and after the above-mentioned flexural resistance test and thermal cycling test.

More specifically, the front and back surfaces of each light-transmissive LED device was observed with eyes, and the presence or absence of air bubbles was checked as a primary check. Samples with which no bubbles were observed were judged as "no bubbles" and the examination was terminated.

On the other hand, samples with which air bubbles were observed by the primary check were subjected to photographing of air bubbles using a microscope with a camera (magnification: ×50). Using the photographs, a maximum distance between arbitrarily selected two points on the contour of an air bubble was measured and determined as an outer diameter of the bubble. Whether the thus-determined diameter of bubble was equal to or exceeded the LED chip size or 500 µm, was checked. Based on the above examination, the evaluation was performed according to the following standard.

A: Air bubbles were not recognized by the primary check by viewing with eyes.

B: Although air bubbles were slightly recognized by viewing with eyes, no air bubbles having an outer diameter equal to or exceeding the LED chip size or 500 µm was observed by checking with a microphotograph.

C: The air bubbles were recognized by viewing with eyes and exhibited an outer diameter equal to or exceeding the LED chip size or 500 µm by checking with a microphotograph.

(Sectional Observation)

Sectional observation was performed with respect to light-transmissive LED devices before and after the above-mentioned flexural resistance test and thermal cycling test. More specifically, each light-transmissive stripe-shaped LED device was embedded within a resin for sectional observation, and the resultant sample was subjected to ion milling by an ion milling apparatus ("E-3500", available from Hitachi Ltd.) to expose a section perpendicular to the longitudinal direction of the strip-shaped LED device and showing a central LED chip, which section was then observed at a magnification of about 10,000 to evaluate the degree of contact between the front and back electrodes and the light-transmissive electroconductive layers opposite to the electrodes and the degree of filling with the elastomer on the electrodes and near the LED chip peripheral wall. The evaluation was performed according to the following standard.

A: Electrodes on an LED chip and the adjacent electroconductive layers on the light-transmissive electroconductive members exhibited a contact with each other, and the elastomer filled up the crevice gap between the unevenness on the electrodes and the opposite electroconductive layers. The elastomer filled up to the peripheral wall of the LED chip.

A2: The electrodes on a one-face electrode-type LED chip and the adjacent electroconductive layer on the light-transmissive electro-conductive member exhibited a contact with each other, and the elastomer filled up the crevice gap between the unevenness on the above-mentioned electrode, and the electroconductive layer. The elastomer filled up to the peripheral wall of the LED chip. However, the elastomer did not fill the gap between the electrode-free face of the LED chip and the adjacent transparent substrate.

B1: The electroconductive layer and the adjacent light-emitting side electrode of a two-face electrode-type LED chip exhibited a contact with each other, and the non-light-emitting side electrode and the adjacent electroconductive layer exhibited a contact with each other. And the circumference of the LED chip was filled up with the elastomer. The crevice gap between the unevenness on the non-light-emitting side electrode of the LED chip and the adjacent electroconductive layer was filled up with the elastomer. However, the crevice gap between the unevenness on the light-emitting-side electrode of the LED chip and the adjacent electroconductive layer was not filled with the elastomer.

C1: The electroconductive layer and the adjacent light-emitting side electrode of a two-face electrode-type LED chip exhibited a contact with each other, and the non-light-emitting side electrode and the adjacent electroconductive layer exhibited a contact with each other. And the circumference of the LED chip was filled up with the elastomer. The crevice gap between the unevenness on the luminescent side electrode of the LED chip and the adjacent electroconductive layer was filled up with the elastomer. However, the crevice gap between the unevenness on the nonlight-emitting-side electrode of the LED chip and the adjacent electroconductive layers was not filled with the elastomer.

C2: The electrodes on a one-face electrode-type LED chip and the electroconductive layers on the adjacent light-transmissive electroconductive member contacted with each other in two pairs, respectively, and the elastomer filled up to the peripheral wall of the LED chip. However, the crevice gaps between the unevenness on the above-mentioned electrodes and the adjacent electroconductive layers, were not filled with the elastomer.

D: Although the electrodes on an LED chip and the adjacent electroconductive layers on the light-transmissive electro-conductive members exhibited a contact with each other, the crevice gaps between the unevenness on the above-mentioned electrodes and the adjacent electroconductive layers, were not filled with the elastomer, and the elastomer did not fill up to the peripheral wall of the LED chip.

<Elastomer Coverage of LED Electrode Surface>

(Two-Face Electrode-Type)

A light-transmissive LED device before and after the above-mentioned flexural resistance test and thermal cycling test and having an LED chip disposition similar to the one illustrated in FIGS. 1 and 2 was subjected to a process including cutting-off at a longitudinal end seal portion thereof with a diamond cutter, and putting an about 5 mm-cut horizontally into the light-transmissive elastomer layer 30 using a microtome. Square bars made of stainless steel, having a width of 5 mm, thickness of 5 mm and a length identical to the end length of the light-transmissive LED luminescent sheet (devices) and equipped with a handle, was bonded firmly onto the outer surfaces at the cut end of the light-transmissive electroconductive member 20A and 20B. A double-face pressure sensitive adhesive tape having the same size as the LED device sample was stuck on a horizontally disposed hard plate, and the outer surface of the light-transmissive electroconductive member 20B was stuck onto the double-face adhesive tape to fix the LED device sample onto the hard plate. While being maintained horizontally, the stainless steel bar bonded to light-transmissive electroconductive member 20A was pulled up slowly in a direction of 90 degrees to the light-transmissive electroconductive member 20B, to peel the light-transmissive electroconductive member 20A off the light-transmissive electroconductive member 20B. As a result of repeating the above operations, several LED device samples with exposed surface of electrode 15A of the LED chip were prepared, and a part thereof was used as a sample for elastomer coverage measurement of the electrode layer 15A of the LED chip.

The remainder of the light-transmissive LED devices from which the light-transmissive electroconductive member 20A had been peeled, was subjected to application of a 180 μm-thick PET film with an adhesives onto the surface including the exposed electrode 15A, while being maintained horizontally, the stainless steel bar bonded to the light-transmissive electroconductive member 20B as mentioned above was pulled up slowly in a direction of 90 degrees to a horizontal plane, to peel the LED device sample off the hard plate. Next, the thus-peeled LED device sample was turned upside down, and the outer surface of the applied 180 μm-thick PET film was stuck onto a hard plate via a double-face adhesive tape to fix the LED device sample onto the hard plate. Then, while being maintained horizontally, the stainless steel bar bonded to light-transmissive electroconductive member 20B was pulled up slowly in a direction of 90 degrees to the hard plate surface, to peel the light-transmissive electroconductive member 20B off the 180 μm-thick PET film applied with the adhesives. As a result, the LED chip with the surface-exposed electrode 15B was left on the PET film. This was used as a sample for elastomer coverage measurement of the electrode layer 15B of the LED chip.

(One-Face Electrode-Type)

Light-transmissive one-face electrode-type LED devices before and after the above-mentioned flexural resistance test and thermal cycling test and having an LED chip disposition similar to the one illustrated in FIG. 14 was treated in a similar manner as the former half of the above section for two-face electrode-type LED devices to peel only the light-transmissive electroconductive member 20C and expose the face including the electrodes 15A and 15B, thereby making samples for measuring the elastomer coverages of the electrodes.

The elastomer coverage measurement was performed by EDX (energy dispersion-type X-ray analysis) using a "NORAY System SIX" energy dispersion-type X-ray spectroscopic analyzer (made by Thermo Fisher Scientific) attached to a field emission scanning electron microscope ("ULTRA55", made by Carl Zeiss), including provision of an electroconductive film of Pt—Pd on exposed electrode surfaces of the above-prepared samples to effect elementary mapping. The analysis was performed by using K-ray of carbon C to determine an area (c) of carbon atom % of 50% or more and an area (d) of the electrode per se and to calculate a ratio of c/d as an elastomer coverage.

Example 1

Two-Face Electrode-Type LED Device

A strip-shaped LED device having a general structure including a length of about 90 mm and a width of about 50 mm was prepared by disposing six two-face electrode-type LED chips connected in series and arranged in a straight line with a spacing of about 5 mm from each other and disposing a pair of elastomer sheets respectively over the two faces of electrodes, followed by sandwiching with a pair of light-transmissive electroconductive member sheets and hot vacuum pressing. A partial laminate structure thereof was similar as shown in FIGS. 1 and 2. Details thereof are described below.

(LED Chip)

As LED chips, GaAlAs/GaAs-based red luminescence LED chips (planar size: about 300×300 μm, whole thickness (height):175 μm) having electrodes on both front and back faces, were provided.

The electrode layers on both faces of each LED chip included a substrate side electrode layer (15A) comprising a 3.5 μm-thick Au layer electrically connected to an N-type semiconductor (N—GaAlAs) layer (42) of an LED body (11) via a semiconductor substrate (41), and a light-emitting side electrode layer (15B) comprising a 0.5 μm-thick Au layer and electrically connected to a P-type semiconductor (P—GaAlAs) layer (44) of the LED body. In the LED chip, the substrate side electrode layer (15A) was formed entirely on one face of the LED body (11), and the light-emitting side electrode layer (15B) was formed on 20% of the other face of the LED body.

In addition, in the LED chip, the substrate side electrode layer (15A) had a surface roughness Ra of 0.5 μm and the light-emitting side electrode layer (15B) had a surface roughness Ra of 0.13 μm.

(Preparation of a Light-Transmissive Electroconductive Member)

Light-transmissive electroconductive members (20A, 20B) were prepared. Each light-transmissive electroconductive member (20) was formed by printing a slurry with ITO fine particles dispersed therein on a 180 μm-thick polyethylene terephthalate (PET) sheet as a transparent substrate, followed by curing with ultraviolet rays at room temperature to form a 1 μm-thick electroconductive layer and patterning thereof by laser irradiation, to form a circuit layer (25) suitable for the series connection of six LED chips arranged in a straight line as mentioned above. The slurry comprised an ultraviolet-curable acrylic transparent resin in which ITO particulates of 0.15 μm in average particle size (aspect ratio: 3.0) were dispersed at a rate of about 90 wt. %.

(Elastomer Sheet)

A 60 μm-thick acrylic elastomer sheet having a Vicat softening temperature of 110° C. was provided as a material constituting a light-transmissive elastomer layer (30), and cut into a sheet (35) with an areal size almost the same as the light-transmissive electroconductive member (20). The glass transition temperature thereof was −40° C., and the elastomer exhibited a melting temperature of 220° C., and tensile storage moduli of 1.1 GPa at 0° C., 0.3 GPa at 100° C. and 0.2 GPa at 110° C. (Vicat softening temperature).

(Lamination)

With reference to FIG. 7 (however, used in a state of upside down), first, a light-transmissive electroconductive member (20A) was held so that its electric conduction circuitry layer was directed upward. Then, an elastomer sheet (35) was laminated, and also an LED chip (10) was disposed thereon, so that the light-emitting side electrode layer (15B) was directed upward. Next, another elastomer sheet (35) was laminated on the light-emitting side electrode layer (15B) of the LED chip, and also the light-transmissive electroconductive member (20B) was laminated thereon with its electric conduction circuitry layer (25B) directed downward.

(Preparation of a Light-Transmissive LED Luminescence Sheet)

The resultant laminate was subjected to a preliminary press at a pressure of 0.1 MPa, a vacuum suction of the atmosphere to 5 or less kPa, and a vacuum hot pressing of 120° C. and 10 MPa for 10 minutes, thereby obtaining a light-transmissive LED luminescence sheet (LED device) wherein the light-transmissive elastomer layer (30) was densely formed between the light-transmissive electroconductive members (20A-20B) and surrounding the LED chip (10) without air bubbles. The peripheral end faces of the obtained light-transmissive luminescence sheet were sealed with a thermosetting resin, to obtain a strip-shaped LED device.

The outline of the manufacturing conditions of above-mentioned Example 1 is summarized and shown in Table 1 appearing hereinafter together with the results of the following Examples and Comparative Examples.

The LED device obtained above was evaluated with respect to the thickness of the light-transmissive insulating elastomer layer, sectional observation, the elastomer coverage of the LED electrode, the flexural resistance, and the thermal cycling test. The results are summarized and shown in Table 2 appearing hereinafter together with the results of the following Examples and Comparative Examples.

Example 2

Two-Face Electrode-Type

A light-transmissive LED device was prepared and evaluated in the same manner as in Example 1 except that the thicknesses of the electroconductive layers of the light-transmissive electroconductive members both on the substrate side and the light-emitting side were both changed to 2 μm, the pressure and heating temperature for the vacuum hot pressing of the laminate were changed to 12 MPa and 110° C., respectively.

Example 3

Two-Face Electrode-Type

A light-transmissive LED device was prepared and evaluated in the same manner as in Example 1 except that the thicknesses of the electroconductive layers of the light-transmissive electroconductive members both on the substrate side and the light-emitting side were both changed to 3 μm, the pressure and heating temperature for the vacuum hot pressing of the laminate were changed to 15 MPa and 100° C., respectively.

Example 4

Two-Face Electrode-Type

A light-transmissive LED device was prepared and evaluated in the same manner as in Example 1 except that the thicknesses of the electroconductive layers of the light-transmissive electroconductive members both on the substrate side and the light-emitting side were both changed to 3 μm, and the elastomer layer thickness was changed to 80 μm.

<Sectional Observation>

In the light-transmissive LED luminescence sheets of the above-described Examples, it was found that the electrode layers on the substrate side and the light-emitting side on the front and back faces of the LED chip exhibited a contact with the electroconductive layers of the light-transmissive electroconductive members on the substrate side and the light-emitting side, respectively, the peripheral sides of the LED chip were filled with the elastomer.

Further, in the light-transmissive LED luminescence sheets of the above-described Examples, it was found that the crevice gap between the surface unevenness on the substrate side electrode layer of the LED chip and the electroconductive layer of the light-transmissive electroconductive member on the substrate side was filled up with the elastomer.

Comparative Example 1

(An Example Wherein an Elastomer Sheet Was Not Disposed on One of Two-Face Electrodes)

A light-transmissive LED device was prepared and evaluated in the same manner as in Example 1 except that the thicknesses of the electroconductive layers (25A, 25B) of the light-transmissive electroconductive members on the substrate side and the light-emitting side were both changed to 3 μm, no elastomer sheet was disposed between the light-transmissive electroconductive member (20A) and the substrate side electrode layer of the LED chip, and a 120 μm-thick elastomer sheet was disposed between the light-transmissive electroconductive member (20B) on the light-emitting side and the light-emitting side electrode layer (15B) of the LED chip.

<Flexural Resistance Test>

In the light-transmissive LED luminescence sheet of this experimental example, one of six samples caused a lighting failure at a bending radius of 100 mm and all of the six samples caused a lighting failure at a bending radius of 80 mm. After being released from the bending, four samples recovered a lighting state. After 10 cycles of the flexural resistance test, all the six samples remained in the non-lighting state even after being released from the bending.

<Thermal Cycling Test>

In the light-transmissive LED luminescence sheet of this experimental example, one sample caused a lighting failure after 1500 cycles, and all six samples caused a lighting failure after 2000 cycles.

<Sectional Observation>

In the light-transmissive LED luminescence sheet of this experimental example, the substrate side electrode layer and the light-emitting side electrode layer on both faces of the LED chip exhibited a contact with the electroconductive layer of the light-transmissive electroconductive member on the substrate side electrode layer and the electroconductive layer of the light-transmissive electroconductive member on the light-emitting side electrode layer, respectively, and the circumference of the LED chip was filled up with the elastomer.

Further, in the light-transmissive LED luminescence sheet of this experimental example, the crevice gap between the surface unevenness on the light-emitting side electrode layer of the LED chip and the electroconductive layer of the light-transmissive electroconductive member on the light-emitting side electrode layer in contact therewith was filled up with the elastomer.

However, in the light-transmissive LED luminescence sheet of this experimental example, it was found that the crevice gap between the surface unevenness on the substrate side electrode layer of the LED chip on which no elastomer layer was disposed at the time of production, and the electroconductive layer of the light-transmissive electroconductive member on the substrate side electrode layer in contact therewith, was not filled with the elastomer.

Example 5

(An Example of Disposing an Elastomer Sheet on the Electrode-Side Face of a One-Face Electrode-Type LED Chip)

A strip-shaped LED device having a general structure roughly identical to that of the device in Example 1 including a length of about 90 mm and a width of about 50 mm was prepared by disposing, however, one-face electrode-type LED chips connected in series and arranged in a straight line with a spacing of about 5 mm from each other and disposing an elastomer sheet over the electrodes on one side, followed by sandwiching with a pair of light-transmissive electroconductive member sheets and hot vacuum pressing. A partial laminate structure thereof is similar as shown in FIGS. 14 and 15. Details thereof are described below.

(LED Chip)

As LED chips, GaN-based blue luminescence LED chips (planar size: about 350×350 μm, whole thickness (height): 175 μm) having two types of electrodes on one face thereof, were provided. An LED chip (10A) had a structure including a sapphire-made substrate (41A), and an N-type semiconductor layer (42), a luminous layer (43) and a P-type semiconductor layer (44) successively laminated in this order on the substrate. On one face (light-emitting face) thereof on the side of the P-type semiconductor layer (44), electrodes (15A and 15B) each comprising 1.5 μm-thick Au were disposed so as to be electrically connected with the N-type semiconductor layer (42) and the P-type semiconductor layer (44), respectively. The electrodes 15A and 15B each had a surface roughness Ra of 0.15 μm.

(A Light-Transmissive Electroconductive Member and a Transparent Substrate)

Similarly as in Example 1, a pair of transparent substrates (21) each comprising a 180 μm-thick polyethylene terephthalate (PET) sheet, were provided, and one of these was made a non-light-emitting-side transparent substrate 21D. On one surface of the other transparent substrate 21C, a slurry obtained by dispersing ITO particulates of 0.15 μm in average particle size (aspect ratio: 3) at a rate of about 90 wt. % in an ultraviolet-curable acrylic transparent resin was applied and cured with ultraviolet rays at room temperature to form a 3 μm-thick film. By partial removal (patterning) of the film by laser irradiation, a light-transmissive electroconductive member 20C was provided with an electroconductive layer 25A for connection with an electrode 15A for an N-type semiconductor and an electroconductive layer 25B for connection with electrode 15B for a P-type semiconductor, which electroconductive layers 25A and 25B were suitable for the series connection of six LED chips arranged in a straight line, as mentioned above.

(Elastomer Sheet)

Similarly as in Example 1, a 60 μm-thick elastomer sheet having a Vicat softening temperature of 110° C. was provided and cut into an areal size comparable to that of the light-transmissive electroconductive member 20C to provide an elastomer sheet 35.

(Lamination)

With reference to FIG. 16, on an electroconductive layer (25) directed upward of the light-transmissive electroconductive member 20C, first an elastomer sheet 35 was laminated, the LED chips 10A were disposed thereon so that light-emitting side electrodes 15A and 15B were directed downward and positionally aligned opposite to the electroconductive layers 25A and 25B, respectively, of the light-transmissive electroconductive member 20C to be laminated with each other. Then, a transparent substrate 21 was laminated on the nonluminescent face 71 of the LED chips 10A, without disposing an elastomer sheet therebetween.

(Preparation of a Light-Transmissive LED Luminescence Sheet)

The resultant laminate was subjected to a preliminary press at a pressure of 0.1 MPa, a vacuum suction of the atmosphere to 5 or less kPa, and a vacuum hot pressing of 120° C. and 10 MPa for 10 minutes, thereby obtaining a light-transmissive LED luminescence sheet (LED luminescent device) wherein the light-transmissive elastomer 30 filled between the light-transmissive electroconductive member 20c with the transparent substrate 21c and surrounding the LED chips 10A without air bubbles, to provide a light-transmissive LED luminescence sheet 1A (FIG. 14). The peripheral end faces of the obtained light-transmissive LED luminescence sheet were sealed with a thermosetting resin, to obtain a strip-shaped LED luminescent device, which was then evaluated in the same manner as in Example 1.

<Sectional Observation>

In the light-transmissive LED luminescence sheets of the above-described Example, it was found that the two types of light-emitting-side electrode layers formed on one face of the LED chip exhibited a contact with the electroconductive layers of the light-transmissive electroconductive member, and the peripheral sides of the LED chip were filled with the elastomer.

Further, in the light-transmissive LED luminescence sheets of the above-described Example, the crevice gaps between the surface unevenness on the two types of light-emitting-side electrode layers of the LED chip and the electroconductive layers in contact therewith of the light-transmissive electroconductive member on the substrate side were found to be filled up with the elastomer.

The gap between the electrode-free face of the LED chip and the transparent substrate was found to be not filled with the elastomer.

Example 6

(An Example of Disposing an Elastomer Sheet on the Electrode Side Face of a One-Face Electrode-Type LED Chip)

A light-transmissive LED luminescent device was prepared and evaluated in the same manner as in Example 5 except that the thickness of the elastomer sheet 35 was changed to 80 μm.

Comparative Example 2

(An Example of Not Disposing an Elastomer Sheet on the Electrode-Side Face of a One-Face Electrode-Type LED Chip)

A light-transmissive LED luminescent device was prepared and evaluated in the same manner as in Example 5 except that a 60 μm-thick elastomer sheet 35 was disposed not on the electrode-side face but on the substrate-side face of the LED chip 10A.

<Flexural Resistance Test>

In the light-transmissive LED luminescence sheet of this experimental example, one of six samples caused a lighting failure at a bending radius of 50 mm and all of the six samples caused a lighting failure at a bending radius of 40 mm. After being released from the bending, four samples recovered a lighting state. After 10 cycles of the flexural resistance test, all the six samples remained in the non-lighting state even after being released from the bending.

<Thermal Cycling Test>

In the light-transmissive LED luminescence sheet of this experimental example, one sample caused a lighting failure after 100 cycles, and all six samples caused a lighting failure after 500 cycles.

<Sectional Observation>

In the light-transmissive LED luminescence sheet of this experimental example, the two types of the light-emitting side electrode layers on one face of the LED chip exhibited a contact with the electroconductive layers of the light-transmissive electroconductive member, and the circumference of the LED chip was filled up with the elastomer.

However, in the light-transmissive LED luminescence sheet of this experimental example, it was found that the crevice gaps between the surface unevenness on the two types of the light-emitting-side electrode layers of the LED chip and the electroconductive layers in contact therewith of the light-transmissive electroconductive member, were not filled with the elastomer.

On the contrary, the gap between the electrode-free face of the LED chip and the transparent substrate was filled up with the elastomer.

Example 7

(An Example of Disposing an Elastomer Sheet on Both Faces of a One-Face Electrode-Type LED Chip)

A light-transmissive LED luminescent device was prepared and evaluated in the same manner as in Example 5 except that the thickness of the elastomer sheet 35 was changed to 30 μm, and such a 30 μm-thick elastomer sheet was disposed not only on the two light-emitting-side electrode layers of the LED chip and also between the other face of the LED chip and the transparent substrate.

Example 8

(An Example Wherein an Elastomer Sheet Was Disposed on Both Faces of a Two-Face Electrode-Type LED Chip and the Electroconductive Layer Was Formed by Sputtering)

A light-transmissive LED luminescent device was prepared and evaluated in the same manner as in Example 1 except for using a light-transmissive electroconductive member obtained by forming not a coated-and-cured slurry type electroconductive layer but a 0.15 μm-thick ITO sputtered film as an electroconductive layer on the 180 μm-thick PET sheet.

Example 9

(An Example Wherein an Elastomer Sheet Was Disposed on Both Faces of a Two-Face Electrode-Type LED Chip and the Electroconductive Layers Were Formed by Sputtering)

A light-transmissive LED luminescent device was prepared and evaluated in the same manner as in Example 8 except that a 45 μm-thick elastomer sheet having a Vicat softening temperature of 140° C. was used, and the vacuum hot pressing was performed at 140° C.

Comparative Example 3

(An Example Wherein an Elastomer Sheet Was Disposed on One Face of a Two-Face Electrode-Type LED Chip and the Electroconductive Layers Were Formed by Sputtering)

A light-transmissive LED luminescent device was prepared and evaluated in the same manner as in Example 8 except that light-transmissive electroconductive members were prepared by forming electroconductive layers by sputtering similarly as in Example 8, and a 100 μm-thick elastomer sheet was disposed only on the light-emitting-side face and not on the non-light-emitting side face of the LED chip.

<Flexural Resistance Test>

In the light-transmissive LED luminescence sheet of this experimental example, one of six samples caused a lighting failure at a bending radius of 100 mm and all of the six samples caused a lighting failure at a bending radius of 80 mm. After being released from the bending, four samples recovered a lighting state. After 10 cycles of the flexural resistance test, all the six samples remained in the non-lighting state even after being released from the bending.

<Thermal Cycling Test>

In the light-transmissive LED luminescence sheet of this experimental example, one sample caused a lighting failure after 50 cycles, and all six samples caused a lighting failure after 500 cycles.

<Sectional Observation>

In the light-transmissive LED luminescence sheet of this experimental example, the two types of electrode layers on both faces of the LED chip exhibited a contact with the electroconductive layers of the light-transmissive electroconductive members, and the circumference of the LED chip was filled up with the elastomer.

However, in the light-transmissive LED luminescence sheet of this experimental example, it was found that the crevice gap between the surface unevenness on the nonlight-emitting-side electrode layer of the LED chip and the electroconductive layer in contact therewith of the light-transmissive electroconductive member was not filled with the elastomer.

On the other hand, the gap between the luminescence face of the LED chip and the transparent substrate was filled up with the elastomer.

Example 10

(An Example Wherein an Elastomer Sheet Was Disposed on Both Faces of a One-Face Electrode-Type Led Chip and the Electroconductive Layers Were Formed by Sputtering)

A light-transmissive LED luminescent device was prepared and evaluated in the same manner as in Example 7 except that a light-transmissive electroconductive member was prepared by forming electroconductive layers by sputtering similarly as in Example 8.

Comparative Example 4

(An Example Wherein an Elastomer Sheet Was Not Disposed on the Electrode Face of a One-Face Electrode-Type Led Chip and the Electroconductive Layers Were Formed by Sputtering)

A light-transmissive LED luminescent device was prepared and evaluated in the same manner as in Comparative Example 2 except that a light-transmissive electroconductive member was prepared by forming electroconductive layers by sputtering similarly as in Example 8.

<Flexural Resistance Test>

In the light-transmissive LED luminescence sheet of this experimental example, two of six samples caused a lighting failure at a bending radius of 50 mm and all of the six samples caused a lighting failure at a bending radius of 40 mm. Even after being released from the bending, 5 samples did not recover a lighting state.

<Thermal Cycling Test>

In the light-transmissive LED luminescence sheet of this experimental example, one sample caused a lighting failure after 100 cycles, and all six samples caused a lighting failure after 500 cycles.

Example 11

(An Example Wherein an Elastomer Sheet Was Disposed on the Electrode Face of a One-Face Electrode-Type Led Chip and the Electroconductive Layers Were Formed by Sputtering)

A light-transmissive LED luminescent device was prepared and evaluated in the same manner as in Example 5 except that a light-transmissive electroconductive member was prepared by forming electroconductive layers by sputtering similarly as in Example 8.

Examples 12, 15 and 16

Light-transmissive LED luminescent devices were prepared and evaluated in the same manner as in Example 5 except that the thicknesses of the electroconductive layers of light-transmissive electroconductive members were changed to 5 μm, 0.5 μm and 12 μm, respectively.

In the flexural resistance test, the light-transmissive LED luminescence sheets of all these Examples exhibited a result that all the six samples retained the lighting state of the LED chips at bending radii down to 30 mm.

In the thermal cycling test, the light-transmissive LED luminescence sheets of all these Examples exhibited a result that all the six samples retained the lighting state of the LED chips even after 2500 cycles.

Examples 13 and 14

Light-transmissive LED luminescent devices were prepared and evaluated in the same manner as in Example 1 except that the thicknesses of the electroconductive layers were changed to 0.5 μm and 12 μm, respectively.

Example 17

Silver halide as a photosensitive compound was applied on a 180 μm-thick PET sheet, exposed and developed to provide a light-transmissive electroconductive member having a square lattice-shaped Ag particle mesh electrode layer with a thickness of 1 μm, a line diameter of 10 μm and an opening of 500 μm as a light-transmissive electroconductive layer.

A light-transmissive LED luminescent device was prepared and evaluated in the same manner as in Example 1 except for using the light-transmissive electroconductive member instead of the light-transmissive electroconductive member having an ITO-dispersed and cured resin film-type light-transmissive electroconductive layer.

Example 18

A light-transmissive LED luminescent device was prepared and evaluated in the same manner as in Example 5 except for using the light-transmissive electroconductive member used in Example 17 instead of the light-transmissive electroconductive member having an ITO-dispersed and cured resin film-type light-transmissive electroconductive layer.

Comparative Example 5

(An Example Wherein Two-Face Electrode-Type Led Chips Were Disposed in Through-Holes Provided in an Elastomer Sheet)

A light-transmissive LED luminescence sheet was prepared by a process disclosed in Patent document 5.
(LED Chip)

Elastomer sheets having a Vicat softening temperature of 110° C. similarly as those used in Example 1 but having a thickness of 120 μm were used to form strip-shaped elastomer sheets with a planar shape identical to those used in Example 1, which were then bored to form six through-holes each suitable for accommodating six LED chips therein. Elastomer sheets thus formed were disposed to accommodate six LED chips disposed in series within the through-holes, and were thereafter subjected to hot vacuum pressing to prepare a light-transmissive LED luminescence sheet, similarly as in Example 1.

<Flexural Resistance Test>

In the light-transmissive LED luminescence sheet of this experimental example, all six samples caused a lighting failure at bending radii down to 100 mm.

<Thermal Cycling Test>

In the light-transmissive LED luminescence sheet of this experimental example, one sample caused a lighting failure after 500 cycles, and all six samples caused a lighting failure after 550 cycles.

<Sectional Observation>

In the light-transmissive LED luminescence sheet of this experimental example, the substrate-side electrode layer and the light-emitting side electrode layer on both faces of the LED chip exhibited a contact with the electroconductive layers of the light-transmissive electroconductive members on the substrate side and the light-emitting side, and the circumference of the LED chip was filled up with the elastomer.

However, in the light-transmissive LED luminescence sheet of this experimental example, it was found that neither the crevice gap between the surface unevenness on the substrate-side electrode layer of the LED chip and the electroconductive layer in contact therewith of the light-transmissive electroconductive member, nor the crevice gap between the surface unevenness on the light-emitting-side electrode layer of the LED chip and the electroconductive layer in contact therewith of the light-transmissive electroconductive member, was filled with the elastomer.

Comparative Example 6

(An Example Wherein the Circumference of a One-Face Electrode-Type Led Chip Was Filled Up With an Adhesive)

A light-transmissive LED luminescence sheet was produced by a process disclosed in Patent document 4.
(LED Chip)

LED chips, a strip-shaped light-transmissive electroconductive member and a strip-shaped transparent substrate, all identical to those used in Example 5, were used.
(Lamination)

Description is made by using reference symbols shown in FIG. 16. A light-transmissive electroconductive member 20C was held so that electroconductive layers 25A and 25B were directed upward, and thereon, the LED chips 10A were disposed so that their two types of electrode layers 15A and 15B as luminescence-side electrode layers were directed downward and aligned with electroconductive layers 25A and 25B, respectively, and fixed with each other with an anisotropic electroconductive adhesive. Then, a transparent substrate 21D was laminated over electrode-free upper faces of the LED chips 10A.

(Production of a Light-Transmissive LED Luminescence Sheet)

The resultant laminate was placed under a vacuum of 5 kPa or below, and an ultraviolet-curable acrylic resin-based adhesive was injected between the light-transmissive electroconductive member 20C and the transparent substrate 21D, and around the LED chips 10A, so as not to leave gaps. Then, the ultraviolet-curable acrylic resin-based adhesive was partially cured by irradiation with ultraviolet rays.

As a result, there was obtained a light-transmissive LED luminescence sheet, as a luminescent device having a flexural resistance and including the surfaces of the LED chip 10A, other than electrode layers 15A and 15B, bonded with the light-transmissive electroconductive member and the transparent substrate. The end faces of the light-transmissive LED luminescence sheet were sealed with a thermosetting resin, to obtain a strip shaped LED luminescent device, which was then evaluated in the same manner as in Example 5.

<Flexural Resistance Test>

In the light-transmissive LED luminescence sheet of this experimental example, all six samples caused a lighting failure at bending radii down to 60 mm.

<Thermal Cycling Test>

In the light-transmissive LED luminescence sheet of this experimental example, one sample caused a lighting failure after 60 cycles, and all six samples caused a lighting failure after 600 cycles.

<Sectional Observation>

In the light-transmissive LED luminescence sheet of this experimental example, the two types of the light-emitting side electrode layers on one face of the LED chip exhibited a contact with the electroconductive layers of the light-transmissive electroconductive member, and the circumference of the LED chip was filled up with the elastomer.

However, in the light-transmissive LED luminescence sheet of this experimental example, it was found that neither the crevice gap between the surface unevenness on the substrate-side electrode layer of the LED chip and the electroconductive layer in contact therewith of the light-transmissive electroconductive member, nor the crevice gap between the surface unevenness on the light-emitting-side electrode layer of the LED chip and the electroconductive layer in contact therewith of the light-transmissive electroconductive member, was filled with the acrylic resin-based adhesive.

Comparative Example 7

(An Example Wherein a Hot Melt Adhesive Sheet Was Disposed Over Both Faces of Two-Face Electrode-Type Led Chips)

A strip-shaped LED luminescent device was prepared and evaluated in the same manner as in Example 1 except for disposing a commercially available 60 μm-thick hot melt adhesive sheet having a softening temperature of 120° C. as measured by a ring and ball method (JIS K7234), instead of the elastomer sheet, over both faces of the LED chips to form a laminate; and subjecting the laminate to 1 minute of pressing at a pressure of 100 kgf/cm² in an environment of atmospheric pressure and a temperature of 180° C., to provide a light-transmissive LED luminescent sheet.

<Flexural Resistance Test>

In the light-transmissive LED luminescence sheet of this comparative example, all six samples retained a lighting state down to a bending radius of 60 mm but caused a lighting failure at a bending radius of 30 mm.

<Thermal Cycling Test>

In the light-transmissive LED luminescence sheet of this experimental example, all six samples caused a lighting failure after 600 cycles.

<Sectional Observation>

In the light-transmissive LED luminescence sheet of this comparative example, almost no adhesive was found to be present in the crevice gap between the surface unevenness on the substrate-side electrode layer of the LED chip and the electroconductive layer in contact therewith of the light-transmissive electroconductive member, or the crevice gap between the surface unevenness on the light-emitting-side electrode layer of the LED chip and the electroconductive layer in contact therewith of the light-transmissive electroconductive member.

Comparative Example 8

With reference to FIG. 9, a light-transmissive LED luminescent sheet was prepared and evaluated in the same manner as in Example 1 except for changing both the thickness of the electroconductive layer (25A) of the light-transmissive electroconductive member on the substrate-side electrode layer and the thickness of the electroconductive layer (25B) of the light-transmissive electroconductive member on the light-emitting-side electrode layer to 3 μm, omitting the disposition of an elastomer sheet between the light-transmissive electroconductive member on the light-emitting surface and the light-emitting surface-side electrode layer (15B) of the LED chip, and changing the thickness of the elastomer sheet (35) disposed between the light-transmissive electroconductive member (25A) on the substrate-side electrode layer and the substrate-side electrode layer (15A) of the LED chip to 120 μm.

<Flexural Resistance Test>

In the light-transmissive LED luminescence sheet of this experimental example, one of six samples caused a lighting failure at a bending radius of 100 mm and all of the six samples caused a lighting failure at a bending radius of 80 mm. After being released from the bending, four samples recovered a lighting state. After 10 cycles of the flexural resistance test, all the six samples remained in the non-lighting state even after being released from the bending.

<Thermal Cycling Test>

In the light-transmissive LED luminescence sheet of this experimental example, one sample caused a lighting failure after 1500 cycles, and all six samples caused a lighting failure after 2000 cycles.

<Sectional Observation>

In the light-transmissive LED luminescence sheet of this experimental example, the substrate side electrode layer and the light-emitting side electrode layer on both faces of the LED chip exhibited a contact with the electroconductive layer of the light-transmissive electroconductive member on the substrate side electrode layer and the electroconductive layer of the light-transmissive electroconductive member on the light-emitting side electrode layer, respectively, and the circumference of the LED chip was filled up with the elastomer.

Further, in the light-transmissive LED luminescence sheet of this experimental example, the crevice gap between the surface unevenness on the light-emitting side electrode layer of the LED chip and the electroconductive layer of the light-transmissive electroconductive member on the side of the light-emitting side electrode layer in contact therewith was filled up with the elastomer.

However, in the light-transmissive LED luminescence sheet of this experimental example, it was found that the crevice gap between the surface unevenness on the substrate side electrode layer of the LED chip on which no elastomer layer was disposed at the time of production, and the electroconductive layer of the light-transmissive electroconductive member on the substrate side electrode layer in contact therewith, was not filled with the elastomer.

With respect to the above-mentioned Examples and Comparative Examples, the outline of the production conditions are summarized in Table 1 and the evaluation results are collectively shown in Table 2, respectively.

TABLE 1

| | Disposed on lower face (*1) of LED. | | | | | | |
|---|---|---|---|---|---|---|---|
| | Transmissive conductive member | | | LED | | | |
| | | | | Electrode | | | |
| | Substrate | Conductive layer | Elastomer sheet (*3) | Two electrodes on one or two faces | Height (μm) (*4) | | Whole thickness (μm) |
| Example | Thickness (μm) | Thickness (μm) | Thickness (μm) | | Lower face (*1) | Upper face (*2) | |
| 1 | 180 | 1 | 60 | two faces | 0.5 | 3.5 | 175 |
| 2 | 180 | 2 | 60 | two faces | 0.5 | 3.5 | 175 |
| 3 | 180 | 3 | 60 | two faces | 0.5 | 3.5 | 175 |
| 4 | 180 | 3 | 80 | two faces | 0.5 | 3.5 | 175 |
| 5 | 180 | 3 | 60 | one face | 1.5 | — | 90 |
| 6 | 180 | 3 | 80 | one face | 1.5 | — | 90 |
| 7 | 180 | 1 | 30 | one face | 1.5 | — | 90 |
| 8 | 180 | 0.15 | 60 | two faces | 0.5 | 3.5 | 175 |
| 9 | 180 | 0.15 | 45 | two faces | 0.5 | 3.5 | 175 |
| 10 | 180 | 0.15 | 30 | one face | 1.5 | — | 90 |
| 11 | 180 | 0.15 | 60 | one face | 1.5 | — | 90 |
| 12 | 180 | 5 | 60 | one face | 1.5 | — | 90 |
| 13 | 180 | 0.5 | 60 | two faces | 0.5 | 3.5 | 175 |
| 14 | 180 | 12 | 60 | two faces | 0.5 | 3.5 | 175 |
| 15 | 180 | 0.5 | 60 | one face | 1.5 | — | 90 |
| 16 | 180 | 12 | 60 | one face | 1.5 | — | 90 |
| 17 | 180 | 1 | 60 | two faces | 0.5 | 3.5 | 175 |
| 18 | 180 | 1 | 60 | one face | 1.5 | — | 90 |
| Comp. 1 | 180 | 3 | 120 | two faces | 0.5 | 3.5 | 175 |
| Comp. 2 | 180 | 3 | — | one face | 1.5 | — | 90 |
| Comp. 3 | 180 | 0.15 | 100 | two faces | 0.5 | 3.5 | 175 |
| Comp. 4 | 180 | 0.15 | — | one face | 1.5 | — | 90 |
| Comp. 5 *6 | 180 | 3 | — | two faces | 0.5 | 3.5 | 175 |
| Comp. 6 *7 | 180 | 3 | — | one face | 1.5 | — | 90 |
| Comp. 7 *8 | 180 | 3 | 60*5 | two faces | 0.5 | 3.5 | 175 |
| Comp. 8 | 180 | 3 | — | two faces | 0.5 | 3.5 | 175 |

| | Disposed on upper face (*2) of LED. | | | | | | |
|---|---|---|---|---|---|---|---|
| | Transmissive conductive member | | | Property of conductor member | | | |
| Example | Elastomer sheet (*3) Thickness (μm) | Substrate Thickness (μm) | Conductive layer Thickness (μm) | Conductive layer | Sheet Resistivity (Ω/□) | Total light transmittance (%) | Haze (%) |
| 1 | 60 | 180 | 1 | ITO dispersed | 180 | 86 | 1.2 |
| 2 | 60 | 180 | 2 | ITO dispersed | 90 | 83 | 1.5 |
| 3 | 60 | 180 | 3 | ITO dispersed | 40 | 83 | 1.5 |
| 4 | 80 | 180 | 3 | ITO dispersed | 40 | 83 | 1.5 |
| 5 | — | 180 | — | ITO dispersed | 40 | 83 | 1.5 |
| 6 | — | 180 | — | ITO dispersed | 40 | 83 | 1.5 |
| 7 | 30 | 180 | — | ITO dispersed | 180 | 86 | 1.2 |
| 8 | 60 | 180 | 0.15 | ITO sputtered | 50 | 85 | 1.1 |
| 9 | 45 | 180 | 0.15 | ITO sputtered | 50 | 85 | 1.1 |
| 10 | 30 | 180 | — | ITO sputtered | 50 | 85 | 1.1 |

TABLE 1-continued

| | | | | | | | |
|---|---|---|---|---|---|---|---|
| 11 | — | 180 | — | ITO sputtered | 50 | 85 | 1.1 |
| 12 | — | 180 | — | ITO dispersed | 30 | 75 | 2.5 |
| 13 | 60 | 180 | 0.5 | ITO dispersed | 1500 | 86 | 0.8 |
| 14 | 60 | 180 | 12 | ITO dispersed | 30 | 48 | 10 |
| 15 | — | 180 | — | ITO dispersed | 1500 | 86 | 0.8 |
| 16 | — | 180 | — | ITO dispersed | 30 | 48 | 10 |
| 17 | 60 | 180 | 1 | Ag mesh | 10 | 82 | 2.5 |
| 18 | — | 180 | 1 | Ag mesh | 10 | 82 | 2.5 |
| Comp. 1 | — | 180 | 3 | ITO dispersed | 40 | 83 | 1.5 |
| Comp. 2 | 60 | 180 | — | ITO dispersed | 40 | 83 | 1.5 |
| Comp. 3 | — | 180 | 0.15 | ITO sputtered | 50 | 85 | 1.1 |
| Comp. 4 | 60 | 180 | — | ITO sputtered | 50 | 85 | 1.1 |
| Comp. 5 *6 | — | 180 | 3 | ITO dispersed | 40 | 83 | 1.5 |
| Comp. 6 *7 | — | 180 | — | ITO dispersed | 40 | 83 | 1.5 |
| Comp. 7 *8 | 60*5 | 180 | 3 | ITO dispersed | 40 | 83 | 1.5 |
| Comp. 8 | 120 | 180 | 3 | ITO dispersed | 40 | 83 | 1.5 |

(*1) Disposed on a lower face in FIG. 2 (two-face electrode-type LED), on a lower face in FIGS. 15 and 16 (one-face electrode-type LED). Light-emitting side in either case.
(*2) Disposed on an upper face in FIG. 2 (two-face electrode-type LED), on an upper face in FIGS. 15 and 16 (one-face electrode-type LED). Non-light-emitting side in either case.
(*3) A light-transmissive thermoplastic elastomer layer
(*4) Height above the LED chip body
*5 Thickness (μm) of a hot melt adhesive sheet
*6 LED was dispoded in a through-hole of an elastomer sheet.
*7 Bonded with an anisotropic conductive adhesive.
*8 A hot melt adhesive sheet was sandwiched between LED electrodes and opposite electroconductive layers.

TABLE 2

| | Elastomer | | | Appearance & Sectional observation | | Flexural resistance | | | Number of lighting samples after thermal cycling test | | |
|---|---|---|---|---|---|---|---|---|---|---|---|
| | | Coverage | | | | Number of lighting | | Number of lighting | After 2000 | After 2500 | After 3000 |
| Example | Total thickness (μm) | On Electrode 15A (%) | On Electrode 15B (%) | Appearance | Sectional Observation | Bending Radius (mm) | samples (piece/piece) | Minimum bending radius (mm) | samples (piece/piece) | cycles (piece/piece) | cycles (piece/piece) | cycles (piece/piece) |
| 1 | 120 | 48 | 65 | A | A | 30 | 6/6 | 20 | 6/6 | 6/6 | 6/6 | 6/6 |
| 2 | 120 | 35 | 56 | A | A | 30 | 6/6 | 20 | 6/6 | 6/6 | 6/6 | 6/6 |
| 3 | 120 | 32 | 53 | A | A | 30 | 6/6 | 20 | 6/6 | 6/6 | 6/6 | 6/6 |
| 4 | 160 | 67 | 80 | A | A | — | — | 20 | 6/6 | — | — | 6/6 |
| 5 | 60 | 62 | 74 | A | A | 30 | 6/6 | 20 | 6/6 | 6/6 | 6/6 | 6/6 |
| 6 | 60 | 25 | 43 | A | A2 | — | — | 20 | 6/6 | — | — | 6/6 |
| 7 | 60 | 18 | 34 | A | A | — | — | 20 | 6/6 | — | — | 6/6 |
| 8 | 120 | 69 | 78 | A | A | 40 | 6/6 | 20 | 4/6 | 6/6 | 4/6 | 3/6 |
| 9 | 90 | 54 | 64 | B | B1 | 40 | 6/6 | 20 | 3/6 | 6/6 | — | 3/6 |
| 10 | 60 | 23 | 29 | A | A | 40 | 6/6 | 20 | 3/6 | 6/6 | — | 2/6 |
| 11 | 60 | 72 | 63 | A | A | 40 | 6/6 | 30 | 5/8 | 6/6 | 5/6 | 2/6 |
| 12 | 60 | 62 | 74 | A | A | 30 | 6/6 | 20 | 6/6 | 6/6 | 6/6 | 6/6 |
| 13 | 120 | 48 | 65 | A | A | 30 | 6/6 | 20 | 4/6 | 6/6 | 6/6 | 4/6 |
| 14 | 120 | 48 | 65 | A | A | 30 | 6/6 | 20 | 5/6 | 6/6 | 6/6 | 5/6 |
| 15 | 60 | 62 | 74 | A | A | 30 | 6/6 | 20 | 5/6 | 6/6 | 4/6 | 4/6 |
| 16 | 60 | 62 | 74 | A | A | 40 | 6/6 | 20 | 4/6 | 6/6 | 5/6 | 5/6 |
| 17 | 120 | 48 | 65 | A | A | 30 | 6/6 | 20 | 6/6 | 6/6 | 6/6 | 6/6 |
| 18 | 60 | 62 | 74 | A | A | 30 | 6/6 | 20 | 6/6 | 6/6 | 6/6 | 6/6 |
| Comp. 1 | 120 | 7 | 78 | B | C1 | 100 | 5/6 | 80 | 0/6 | 0/6 | — | — |
| Comp. 2 | 60 | 2 | 4 | B | C2 | 50 | 5/6 | 40 | 0/6 | 0/6 | — | — |
| Comp. 3 | 100 | 3 | 67 | C | C1 | 100 | 5/6 | 80 | 0/6 | 0/6 | — | — |
| Comp. 4 | 60 | 3 | 5 | C | C2 | 50 | 4/6 | 40 | 0/6 | 0/6 | — | — |
| Comp. 5 | 120 | 2 | 3 | C | D | — | — | 100 | 0/6 | 0/6 | — | — |

TABLE 2-continued

| Example | Elastomer Total thickness (μm) | Elastomer Coverage On Electrode 15A (%) | Elastomer Coverage On Electrode 15B (%) | Appearance & Sectional observation Appearance | Appearance & Sectional observation Sectional Observation | Flexural resistance Number of lighting Bending Radius (mm) | Flexural resistance Number of lighting samples (piece/piece) | Flexural resistance Number of Minimum bending radius (mm) | Flexural resistance Number of lighting samples (piece/piece) | Number of lighting samples after thermal cycling test After 2000 cycles (piece/piece) | Number of lighting samples after thermal cycling test After 2500 cycles (piece/piece) | Number of lighting samples after thermal cycling test After 3000 cycles (piece/piece) |
|---|---|---|---|---|---|---|---|---|---|---|---|---|
| Comp. 6 | 175 *1 | 2 | 4 | C | D | 60 | 0/6 | — | — | — | — | — |
| Comp. 7 | 120 *2 | 12 | 9 | C | D | 60 | 6/6 | 30 | 0/6 | 0/6 | — | — |
| Comp. 8 | 120 | 75 | 6 | B | B1 | 100 | 5/6 | 80 | 0/6 | 0/6 | — | — |

*1 Thickness (μm) of adhesive layer
*2 Thickness (μm) of hot melt adhesive layer In the above, although some embodiments of the present invention have been described, these embodiments are presented merely as an example and are not intended to limit the scope of the invention. These novel embodiments can be practiced in various other forms and can be subjected to various omission, replacement and modification. These embodiments and modifications thereof are included in the scope and gist of the invention, and they are included in the invention recited in the claims, and equivalents thereof.

INDUSTRIAL APPLICABILITY

As mentioned above, the present invention provides a light-emitting device which is excellent in flexural resistance and thermal cycle characteristic and can maintain a lighting state in resistance to strong bending and heat load, through a production process characterized by vacuum pressing at a temperature around or slightly above the Vicat softening temperature of a light-transmissive elastomer.

DESCRIPTION OF NOTATIONS 1, 1A, 1B, 90, 90A: Light-emitting device
10: LED Chip (Two-face Electrode-type), 10A LED chip (One-face Electrode-type)
11: LED body (Two-face Electrode-type), 11A LED body (One-face Electrode-type)
13: Circumference of LED Chip
15: Electrode Layer
15A: First electrode layer (cathode layer, electrode layer)
15B: Second electrode layer (anode layer, electrode layer)
17: Peripheral Face of Electrode Layer
18: Edge of Electrode Layer
20: Light-transmissive Electroconductive Member
20A: First light-transmissive electroconductive member
20B: Second light-transmissive electroconductive member
20C: Light-transmissive electroconductive member of a second embodiment
21, 21A, 21B, 21C, 21D: Transparent substrate
25: Light-transmissive Electroconductive Layer
25A: First light-transmissive electroconductive layer (light-transmissive electroconductive layer)
25B: Second light-transmissive electroconductive layer (light-transmissive electroconductive layer)
26: Surface of Light-transmissive Electroconductive Layer
30: Light-transmissive Elastomer Layer
35: Temporary Light-transmissive-Elastomer Layer
36, 36A, 36B: Bump electrode
36S: Au bump
41: LED Semiconductor Substrate (Two-face Electrode-type)
41A: LED heat-resistant board (One-face electrode-type)
42: N-type Semiconductor Layer
44: P-type Semiconductor Layer
43: Luminescent Layer
45: Unevenness
46: Concavity
47: Convexity
48: Crevice gap
71: Face of LED Body
71A: First face of LED body
71B: Second face of LED body
71C: Third face of LED body
71D: Fourth face of LED body
72: N-type Semiconductor Luminescent Layer-side Boundary
85: Light-emitting face
91: Opening
92: Crack
95: Fixing resin for sectional observations

The invention claimed is:

1. A flexible light-emitting device, comprising:
   first and second light-transmissive and flexible insulator sheets;
   first and second light-transmissive electroconductive layers;
   a light-emitting semiconductor element comprising a first electrode electrically connected to the first light-transmissive electroconductive layer, and a second electrode electrically connected to the second light-transmissive electroconductive layer, wherein each of the first electrode and the second electrode has a surface that has convexities and concavities; and
   an insulating light-transmissive elastomer disposed at least (i) in a part of a region between the first electrode and the first light-transmissive electroconductive layer, and in the concavities of the surface of the first electrode, and (ii) in a part of a region between the second electrode and the second light-transmissive electroconductive layer, and in the concavities of the surface of the second electrode; wherein:
   the first and second light-transmissive electroconductive layers, the light-emitting semiconductor element, and the light-transmissive elastomer fill a region between the first insulator sheet and the second insulator sheet, and
   the convexities of the first electrode directly contact the first light-transmissive electroconductive layer, and the second electrode is connected to the second light-transmissive electroconductive layer via a bump electrode.

2. The light-emitting device according to claim 1, wherein the light-transmissive elastomer covers 10-90% of each of an area of the first electrode and an area of the second electrode.

3. The light-emitting device according to claim 1, wherein each of the first electrode and the second electrode has a surface roughness Ra of 0.1-10 µm.

4. The light-emitting device according to claim 1, wherein said light-transmissive elastomer comprises an acrylic elastomer.

5. The light-emitting device according to claim 1, wherein the light-transmissive elastomer is a polymeric elastic material.

6. The light-emitting device according to claim 1, wherein each of the first and second light-transmissive electroconductive layers comprises a conductor film, a transparent resin layer containing a particulate conductor, or a mesh electrode.

7. The light-emitting device according to claim 1, wherein each of the first and second light-transmissive electroconductive layers comprises a sputtered film or vapor-deposited film of a conductor.

8. The light-emitting device according to claim 1, wherein each of the first and second light-transmissive electroconductive layers comprises a mesh electrode layer.

9. The light-emitting device according to claim 1, wherein each of the first and second light-transmissive electroconductive layers comprises a plurality of light-transmissive electroconductive fillers and a light-transmissive resin binder binding the electroconductive fillers in a mutually contacting state.

10. The light-emitting device according to claim 9, wherein the plurality of light-transmissive electroconductive fillers occupy 50-95 wt. % of each of the first and second light-transmissive electroconductive layers.

11. The light-emitting device according to claim 1, wherein each of the first and second light-transmissive electroconductive layers has a sheet resistivity of at most 1000 ohm/□.

12. The light-emitting device according to claim 1, wherein each of the first and second light-transmissive electroconductive layers has a thickness in a range of 0.1-10 µm.

13. The light-emitting device according to claim 1, wherein each of the first and second light-transmissive electroconductive layers are free from bubbles having a diameter that is equal to or larger than 500 µm or a chip size of the light-emitting semiconductor element.

14. A process for producing the light-emitting device according to claim 1, comprising:
disposing the light-transmissive elastomer between an electrode surface of the light-emitting semiconductor element and a surface of the first and second light-transmissive electroconductive layers of a light-transmissive electroconductive member, and
then subjecting the light-emitting semiconductor element and the light-transmissive electroconductive member to vacuum hot pressing at a temperature which is in a range of from 10° C. below to 30° C. above the Vicat softening temperature of the light-transmissive elastomer.

15. An apparatus comprising a display apparatus or an illumination apparatus including the light-emitting device according to claim 1.

16. The light-emitting device according to claim 1, wherein the bump electrode comprises Au or Ag.

17. The light-emitting device according to claim 1, wherein the bump electrode has been pressed to have a flattened top.

18. The light-emitting device according to claim 1, wherein the bump electrode has a size of about 50-100 micro-meter in both diameter and height.

19. The light-emitting device according to claim 1, wherein each of the first and second insulator sheets has a flexural modulus (measured according to ISO178 (JIS K7171:2008) in a range of 150 to 320 kgf/mm$^2$.

20. The light-emitting device according to claim 1, wherein the first light-transmissive electroconductive layer is located on a lower surface of the first insulator sheet, and the second light-transmissive electroconductive layer is located on an upper surface of the second insulator sheet.

* * * * *